(12) United States Patent
Walzer et al.

(10) Patent No.: US 10,950,811 B2
(45) Date of Patent: Mar. 16, 2021

(54) OPTOELECTRONIC COMPONENT

(71) Applicant: Heliatek GmbH, Dresden (DE)

(72) Inventors: Karsten Walzer, Dresden (DE); Martin Pfeiffer, Dresden (DE); Andre Weiss, Ulm (DE); Christian Uhrich, Dresden (DE); Marieta Levichkova, Dresden (DE); Gunter Mattersteig, Ulm (DE)

(73) Assignee: Heliatek GmbH, Dresden (DE)

( * ) Notice: Subject to any disclaimer, the term of this patent is extended or adjusted under 35 U.S.C. 154(b) by 325 days.

(21) Appl. No.: 14/769,469

(22) PCT Filed: Feb. 21, 2014

(86) PCT No.: PCT/EP2014/053479
§ 371 (c)(1),
(2) Date: Aug. 21, 2015

(87) PCT Pub. No.: WO2014/128278
PCT Pub. Date: Aug. 28, 2014

(65) Prior Publication Data
US 2016/0020419 A1    Jan. 21, 2016

(30) Foreign Application Priority Data

Feb. 21, 2013  (DE) ...................... 10 2013 101 715.0
Sep. 19, 2013  (DE) ...................... 10 2013 110 373.1

(51) Int. Cl.
*H01L 51/42* (2006.01)
*H01L 51/44* (2006.01)
(Continued)

(52) U.S. Cl.
CPC .......... *H01L 51/4253* (2013.01); *B82Y 10/00* (2013.01); *H01L 51/441* (2013.01);
(Continued)

(58) Field of Classification Search
CPC ............... H01L 51/4253; H01L 51/441; H01L 51/0073; H01L 51/0054; H01L 51/0046; Y02E 10/549
See application file for complete search history.

(56) References Cited

U.S. PATENT DOCUMENTS 4,863,822 A   9/1989  Fukagai et al.
7,825,326 B2  11/2010  Koppe
(Continued)

FOREIGN PATENT DOCUMENTS

CN   102153733       8/2011
DE   102010033026 A1  2/2012
(Continued)

OTHER PUBLICATIONS

Liao et al, Multiple Functionalities of Polyfluorene Grafted with Metal Ion-Intercalated Crown Ether as an Electron Transport Layer for Bulk-Heterojunction Polymer Solar Cells: Optical Interference, HoleBlocking, Interfacial Dipole, and Electron Conduction 2012, JACS, 134, 14271-14274 (Year: 2012).*
(Continued)

*Primary Examiner* — Bethany L Martin
(74) *Attorney, Agent, or Firm* — Heslin Rothenberg Farley & Mesiti P.C.

(57) ABSTRACT

An optoelectronic component includes a photoactive layer which is arranged between an electrode and a counter electrode. In addition to a donor-acceptor system, the photoactive layer includes a third material which influences the crystallization of the donor-acceptor system. The third material selected from a group consisting of crown ethers, triphenyls, sorbitols, quinacridones and bis(4-(tert-butyl)benzoato-O) hydroxyaluminium. Crown ethers are especially preferred.

18 Claims, 17 Drawing Sheets

Figure 1:
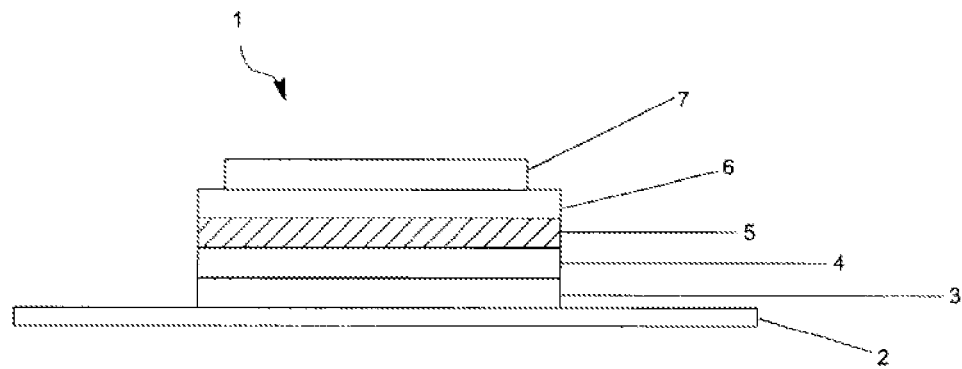

(51) Int. Cl.
*H01L 51/00* (2006.01)
*B82Y 10/00* (2011.01)

(52) U.S. Cl.
CPC ...... *H01L 51/0046* (2013.01); *H01L 51/0054* (2013.01); *H01L 51/0073* (2013.01); *Y02E 10/549* (2013.01)

(56) References Cited

U.S. PATENT DOCUMENTS

| | | |
|---|---|---|
| 2005/0164019 A1 | 7/2005 | Liu et al. |
| 2007/0090371 A1 | 4/2007 | Drechsel et al. |
| 2007/0181178 A1 | 8/2007 | Sohn et al. |
| 2008/0026229 A1* | 1/2008 | Stossel ............... H01L 51/5048 428/423.1 |
| 2009/0081357 A1* | 3/2009 | Taka ..................... B82Y 20/00 427/66 |
| 2009/0217980 A1* | 9/2009 | Pfeiffer ................. B82Y 10/00 136/263 |
| 2011/0272030 A1 | 11/2011 | Kitazawa et al. |
| 2012/0312364 A1* | 12/2012 | Uhrich ................. H01L 51/442 136/255 |
| 2013/0087778 A1* | 4/2013 | Konuma ............... C09K 11/06 257/40 |
| 2013/0140527 A1 | 6/2013 | Chen et al. |
| 2013/0167930 A1 | 7/2013 | Hildebrandt et al. |
| 2013/0167931 A1 | 7/2013 | Hildebrandt et al. |

FOREIGN PATENT DOCUMENTS

| | | | | |
|---|---|---|---|---|
| EP | 238556 A1 | 3/1987 | | |
| JP | S63220158 | 9/1988 | | |
| JP | 2005243615 | 9/2005 | | |
| JP | 2008293895 | 12/2008 | | |
| JP | 2010067642 | 3/2010 | | |
| JP | 2012109544 | 6/2012 | | |
| WO | 87/01621 A1 | 3/1987 | | |
| WO | 2004/083958 A2 | 9/2004 | | |
| WO | 2004090921 | 10/2004 | | |
| WO | 2006/092134 A1 | 9/2006 | | |
| WO | WO2011158592 | * 5/2011 | ............. | C09K 11/06 |
| WO | WO2011073219 | * 6/2011 | ......... | H01L 51/5048 |
| WO | 2011/161170 A1 | 12/2011 | | |
| WO | 2011/161262 A1 | 12/2011 | | |
| WO | 10084865 | 7/2012 | | |

OTHER PUBLICATIONS

Liou et al , Determination of Orders of Relative Alkali Metal Ion Affinities of Crown Ethers and Acyclic Analogs by hte Kinetic Method , American Society for Mass Spectrometry, 1992, vol. 3, pp. 543-548.*

International Search Report for International Application PCT/EP2014/053479, dated Apr. 11, 2014.

Almantas Pivrikas et al: "Influence of processing additives to nano-morphology and efficiency of bulk-heterojunction solar cells: A comparative review" Solar Energy, vol. 85, No. 6, Dec. 21, 2010, pp. 1226-1237.

Christoph J. Brabec et al: "Influence of blend microstructure on bulk heterojunction organic photovoltaic performance" Chemical Society Reviews, vol. 40, No. 3, Nov. 16, 2010, pp. 1185-1199.

Harald Hoppe et al: "Morphology of polymer/fullerene bulk heterojunction solar cells" Journal of Materials Chemistry, Royal Society of Chemistry, GB, vol. 16, No. 1, Jan. 1, 2006, pp. 45-61.

Hsiang-Yu Chen et al: "Fast-Grown Interpenetrating Network in Poly(3-hexylthiophene): Methanofullerenes Solar Cells Processed with Additive" Journal of Physical Chemistry C, vol. 113, No. 18, May 7, 2009, pp. 7946-7953.

Peet J et al: "Method for increasing the photoconductive response in conjugated polymer/fullerene composites" Applied Physics Letters, American Institute of Physics, US, vol. 89, No. 25, Dec. 18, 2006, pp. 252105-252105-3.

* cited by examiner

OPTOELECTRONIC COMPONENT

CROSS REFERENCE TO RELATED APPLICATIONS

This application is a national stage filing under section 371 of International Application No. PCT/EP2014/053479, filed on Feb. 21, 2014, and published in German on Aug. 28, 2014, as WO 2014/128278 and claims priority of German applications No. DE 102013101715.0 filed on Feb. 21, 2013, and No. DE 102013110373.1 filed on Sep. 19, 2013, the entire disclosure of these applications being hereby incorporated herein by reference.

BACKGROUND ART

The invention relates to an optoelectronic component having a photoactive layer disposed between an electrode and a counterelectrode.

Optoelectronic components, for instance solar cells or LEDs, TFTs, etc., find wide use nowadays in everyday life and in the industrial sector.

For example, there are known thin-film solar cells which have a flexible configuration and hence allow arrangement on curved surfaces. Solar cells of this kind preferably have active layers composed of amorphous silicon (a-Si) or CIGS ($Cu(In,Ga)(S,Se)_2$).

A particular disadvantage of these thin-film solar cells is the high production costs, caused by the materials.

Also additionally known are solar cells having organic active layers with a flexible configuration (Konarka-Power Plastic Series). The organic active layers may be formed from polymers (e.g. U.S. Pat. No. 7,825,326 E2) or small molecules (e.g. EP m 2383556 A1). While it is a feature of polymers that they are not evaporable and therefore can only be applied from solutions, small molecules are evaporable.

The advantage of such organic-based components over the conventional inorganic-based components (semiconductors such as silicon, gallium arsenide) is that some of the optical absorption coefficients are extremely high (up to $2 \times 10^4$ $cm^{-1}$), and so it is possible to produce very thin solar cells with a low material requirement and energy expenditure. Further technological aspects are the low costs, the possibility of producing flexible large-area components on plastic films, and the virtually unlimited variation options and the unlimited availability of organic chemistry. A further advantage is the possibility of being able to produce transparent components which can be used in glass applications, for example.

A solar cell converts light energy to electrical energy. The term "photoactive" in the case of solar cells refers to the conversion of light energy to electrical energy. In contrast to inorganic solar cells, the light does not directly produce free charge carriers in organic solar cells; instead, excitons are formed at first, i.e. electrically neutral excited states (bound electron-hole pairs). Only in a second step are these excitons separated into free charge carriers which then contribute to the flow of electrical current.

A possible way of implementing an organic solar cell which has already been proposed in the literature is that of a pin diode having the following layer structure:
 0. carrier, substrate,
 1. base contact, usually transparent,
 2. p layer(s),
 3. i layer(s),
 4. n layer(s),
 5. top contact.

In this context, n and p respectively mean n- and p-doping leading to an increase in the density of free electrons or holes in the thermal equilibrium state. However, it is also possible that the n layer(s) and p layer(s) are at least partly nominally undoped and only have preferentially n-conductive or preferentially p-conductive properties because of the material properties (for example different mobilities), because of unknown impurities (for example remaining residues from the synthesis, breakdown or reaction products during layer production), or because of environmental influences (for example adjoining layers, inward diffusion of metals or other organic materials, gas doping from the surrounding atmosphere). In this context, layers of this kind are considered primarily to be transport layers. The term "i layer", in contrast, refers to a nominally undoped layer (intrinsic layer). One or more i layers may consist here layers either of one material or a mixture of two or more materials (what are called interpenetrating networks or a bulk heterojunction). The incident light which enters through the transparent base contact produces excitons (bound electron-hole pairs) in the i layer or in the n/p layer. These excitons can be separated only by very high electrical fields or at suitable interfaces. In organic solar cells, sufficiently high fields are unavailable, and so all promising designs for organic solar cells are based on exciton separation at photoactive interfaces. The excitons diffuse to such an active interface, where electrons and holes are separated from one another. The material which accepts the electrons is referred to as acceptor, and the material which accepts the hole as donor. The separating interface may be between the p (n) layer and the i layer, or between two i layers. In the installed electrical field in the solar cell, electrons are then transported away to the n region and the holes to the p region. Preferably, the transport layers are transparent or substantially transparent materials having a large bandgap (wide-gap), as described, for example, in WO 2004083958. Wide-gap materials refer here to materials having an absorption maximum in the wavelength range of <450 nm, preferably <100 nm.

Means of adjusting the LUMO level or the HOMO level are known to those skilled in the art, in that very many organic materials having different positions of the energy levels of the HOMOs and LUMOs are known. The adjustment is therefore effected by selecting and using a material having the desired position of the energy levels of the HOMO and LUMO. In addition, for example through the incorporation of electron-withdrawing or electron-donating groups, it is possible to lower or increase the HOMO and LUMO levels of organic materials and hence to adjust a material according to the requirements.

Since the light always first produces excitons and does not yet produce any free charge carriers, the low-recombination diffusion of excitons to the active interface plays a critical role in organic solar cells.

If the i layer is a mixed layer, the function of light absorption is assumed either by just one of the components or else by both. The advantage of mixed layers is that the excitons produced have to cover just a very short distance before they arrive at a domain boundary where they are separated. The electrons and holes are transported away separately into the respective materials. Since the materials are in contact throughout the mixed layer, it is crucial in the case of this concept that the separate charges have a long lifetime on the particular material, and continuous percolation paths exist for both charge carrier types from any point to the respective contact.

To date, in the field of small molecules, the absorber layer thicknesses have been limited to about 30-40 nm (in the best case 60 nm), whereas up to 200 nm are possible in the polymer field while maintaining a good fill factor (FF) (>60%). The reason is the poorer transport of charge carriers in SM-OPVs (organic solar cells comprising small molecules), since there is no on-chain transport, in contrast to polymers. In the field of organic solar cells comprising small molecules, the problem has been solved to date by ever higher extinction coefficients (in solution, up to 100 000 or higher), which have led to good efficiencies combined with good FF. Because of the cyanine limit, however, this is not capable of infinite improvement. Therefore, there is a search for solutions by which mixed donor-acceptor layers (called bulk hetero-junctions, BHJs) can be made thicker, in order to increase the quantum yield.

It is an object of the present invention to specify an optoelectronic component and a process for producing an optoelectronic component having an improved quantum yield.

It would be possible to achieve an increased quantum yield through an increase in the layer thickness of the photoactive layer. However, problems here are the occurrence of torsion in the oligomer units and excessive crystallization, which often causes short circuits.

BRIEF SUMMARY OF INVENTION

According to the invention, therefore, an optoelectronic component comprising at least one photoactive layer is proposed, wherein the photoactive layer comprises a mixed multiple layer containing at least three materials, wherein at least one organic material is composed of small molecules, wherein at least one material is a donor and at least one material is an acceptor, wherein the donor and the acceptor form a donor-acceptor system with at least one third material which is set up so as to affect the propensity of the donor and/or acceptor to crystallize.

In the context of the present invention, small molecules are understood to mean non-polymeric organic molecules having monodisperse molar masses between 100 and 2000, which are in the solid phase under standard pressure (air pressure of the surrounding atmosphere) and at room temperature. More particularly, these small molecules may also be photoactive, "photoactive" being understood to mean that the molecules undergo a change in charge state when energy is supplied. Energy supply is understood to mean light energy supply, for example visible light or UV light, or else electrical energy supply.

In one embodiment of the invention, the third material has an energy level at which the magnitude of the LUMO <=the LUMO of the acceptor, and the magnitude of the HOMO >=the HOMO of the donor. The difference between HOMO and LUMO of the third material is therefore greater than or at least equal to the difference between the HOMO of the donor and the LUMO of the acceptor, as per FIG. 30.

The terms "HOMO" and "LUMO" are understood, as usual in chemistry, to mean highest occupied molecular orbital and lowest unoccupied molecular orbital. The term relates both to individual molecules and to solids or material films. The energy levels of HOMO and LUMO can be determined in the manner known to those skilled in the art, for example via cyclic voltammetry (CV) or ultraviolet photoelectron spectroscopy (UPS).

In a further embodiment of the invention, the third material has an energy level where the magnitude of the LUMO of the third material is preferably 0.3 eV lower than the LUMO of the acceptor material of the photoactive layer and/or the magnitude of the HOMO of the third material is 0.3 eV above the magnitude of the energy level of the HOMO of the donor material of the photoactive layer.

In a further embodiment of the invention, the proportion of the third material in the photoactive layer is <10%.

In a further embodiment of the invention, the proportion of the third material in the photoactive layer is between 10% and 50%.

In a further embodiment of the invention, the proportion of the third material in the photoactive layer is 0.1% by weight <x<30% by weight, preferably 0.1% by weight <x<20% by weight, more preferably 0.1% by weight <x<10% by weight.

In a further embodiment of the invention, the third material simultaneously improves charge transport within the photoactive layer.

In a further embodiment of the invention, at least one donor material in the photoactive layer is an oligomer.

In the context of the invention, oligomers are understood to mean non-polymeric organic molecules which have monodisperse molar masses between 100 and 2000 and are in the solid phase under standard pressure (air pressure of the surrounding atmosphere) and at room temperature.

In a further embodiment of the invention, at least one donor material D1 in the photoactive layer is an oligomer, where the magnitude of the HOMO of the donor material D1 is equal to the magnitude of the HOMO of the third material and the magnitude of the LUMO of the donor material D1 is equal to the magnitude of the LUMO of the third material.

In a further embodiment of the invention, the third material is an oligomer.

In a further embodiment of the invention, the third material is set up so as to prevent crystallization of donor and/or acceptor. At the same time, the third material may be a hole conductor, an electron conductor or an ambipolar transporting material, where the latter may also, for example, be a mixture of electron and hole conductor.

In a further embodiment of the invention, the third material, because of its molecular structure, minimizes crystallization of the donor and/or acceptor phase. By virtue of the better mixing of donor and acceptor, it is possible for more excitons to reach a separating interface and to be separated into charge carriers and hence to contribute to the current.

In a further embodiment of the invention, the molecular structure of the third material is substantially similar to the molecular structure of the donor material D1, as a result of which the third material acts as a lattice defect in the donor material D1, and so the donor material D1 does not crystallize too significantly as a pure phase.

A lattice defect (also lattice imperfection or crystal defect) refers to any irregularity in an otherwise periodic crystal lattice. The existence of lattice imperfections distinguishes a real crystal from the theoretical model of an ideal crystal. Lattice imperfections are of fundamental significance for many properties of a crystal, especially for the chemical reactivity, mass transfer and diffusion within the crystal, and for the mechanical properties thereof. The lattice defects are classified with reference to the spatial extent of the defect area. The number of spatial dimensions in which the lattice defect has more than an atomic extent is identified. In this way, zero- to three-dimensional lattice defects are distinguished.

In one embodiment of the invention, the molecular structure of the third material is set up such that the third material causes a lattice defect in the donor and/or acceptor material.

In one embodiment of the invention, the molecular structure of the third material is substantially similar to the structure of the acceptor material A1, as a result of which the third material acts as a lattice defect in the acceptor material A1, and so the acceptor material A1 does not crystallize too significantly as a pure phase.

In a further embodiment of the invention, the third material is set up such that the crystallization of donor material and/or acceptor material is improved. In this case, the third material ensures phase separation and hence improves charge transport in the individual phases by creating more continuous conduction pathways. The improved phase separation can be demonstrated, for example, by a reduced photoluminescence signal in the triple mixed layer compared to that without the third material.

In a further embodiment of the invention, the third material is selected such that the third material establishes a minimum separation between the acceptor and donor, wherein the third material simultaneously contributes to the phase separation of the acceptor and donor. Thus, the problem of "geminal recombination" can be reduced.

In the context of the invention, geminal recombination is understood to mean the recombination of already separated charge carriers with one another.

In a further embodiment of the invention, the third material, in its molecular structure, has a first region set up to be fullerenophilic and a second region set up to be fullerenophobic, wherein the first and second regions are set up with spatial separation.

In the context of the invention, fullerenophilic is understood to mean a molecular structure or at least part of a molecular structure which has a preference for proximity to fullerenes ($C_{60}$, $C_{70}$, etc.).

In the context of the invention, fullerenophobic is understood to mean a molecular structure or at least part of a molecular structure which has a preference for remoteness from fullerenes ($C_{60}$, $C_{70}$, etc.).

In a further embodiment of the invention, the optoelectronic component has more than one photoactive layer between the electrode and the counterelectrode. The component may take the form, for instance, of a tandem cell or triple cell. This is especially advantageous since the incident light passes through several photoactive layers within the component. Particularly advantageously, the various absorber layers are matched to one another, the absorber layers having different absorption maxima. This enables efficient utilization of the incident light.

In a further embodiment of the invention, at least one of the photoactive layers, as acceptor, comprises a material from the group of the fullerenes or fullerene derivatives.

In a further embodiment of the invention, at least one doped, partly doped or undoped transport layer is disposed between the electrode and the counterelectrode.

In a further embodiment of the invention, the optoelectronic component is semitransparent at least within a certain light wavelength range.

In a further embodiment of the invention, the optoelectronic component is an organic solar cell.

In a further embodiment of the invention, the component is a pin single, pin tandem cell, pin multiple cell, nip single cell, nip tandem cell or nip multiple cell.

In a further embodiment of the invention, the component consists of a combination of nip, ni, bp, pnip, pni, pip, nipn, nin, ipn, pnipn, pnin or pipn structures in which a plurality of independent combinations containing at least one i layer are stacked.

In a further embodiment of the invention, the third material is selected from a group consisting of crown ethers, triphenyls, sorbitols, quinacridones, bis(4-(tert-butyl)benzoato-O)hydroxyaluminum.

In a further embodiment of the invention, as the third material, crown ethers of the general formula (Ia and Ib) are selected.

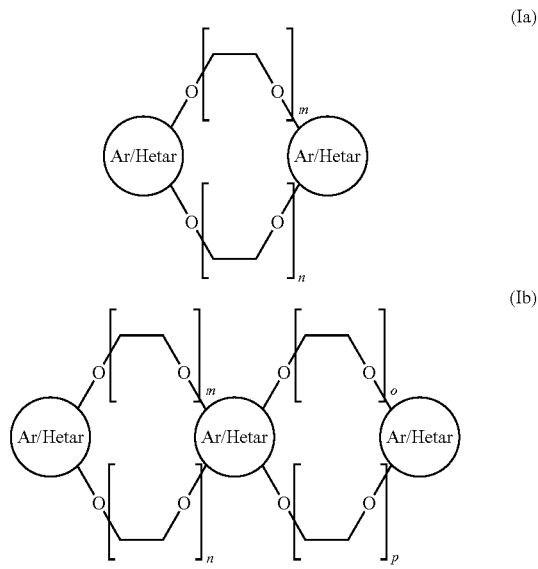

with Ar=phenyl, biphenyl, triphenyl, naphthyl, binaphthyl, 3-6 fused phenyl rings (e.g. anthracenyl, phenanthrenyl, pyrenyl)

Hetar=thiophene, pyrrole, furan, oxazole, thiazole, oxadiazole, thiadiazole, triazole, pyridine, pyrimidine, pyrazine, benzothiophenes, benzopyrrole, benzofuran, benzothiophene, benzopyrrole, benzofuran, benzoxazole, benzothiazole, thienothiophenes, thienopyrrole, thienofuran, 3-6 fused heterocycles, dithienothiophene, dithienopyrrole, dithienobenzene, dithienocyclopentadienes, dipyrrolobenzene, ether bridges joined in 1,2, 1,3 and 1,4 positions on the particular phenyl ring (ortho, meta and para positions), naphthyl ring, fused phenyl ring, and heteroaryl ring and fused heteroaryl ring, m and n are each independently 1, 2, 3, 4, 5, 6, o and p are each independently 0, 1, 2, 3, 4, 5, 6.

More particularly, dibenzo-crown ethers and dinaphthocrown ethers and mixed benzo-/naphtho-crown ethers are used. Preference is given to compounds having the following structures:

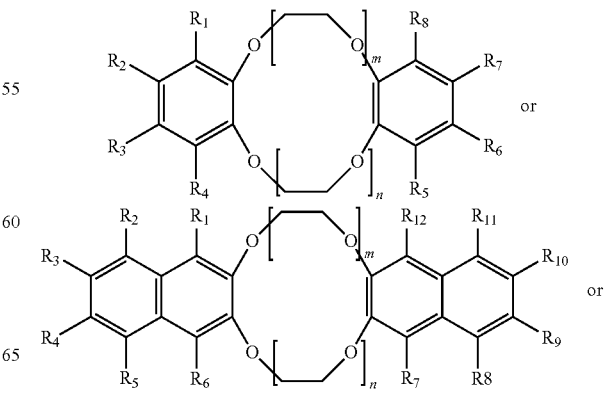

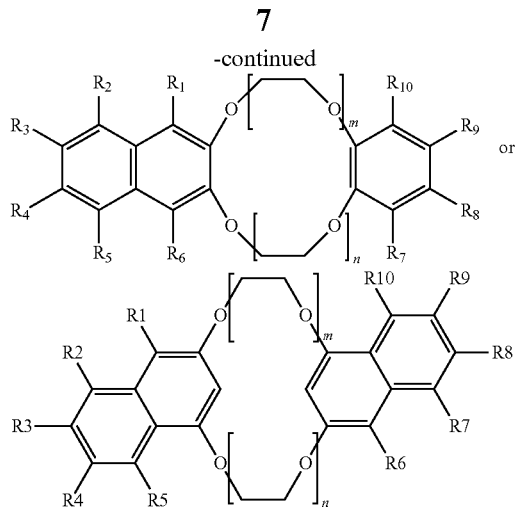

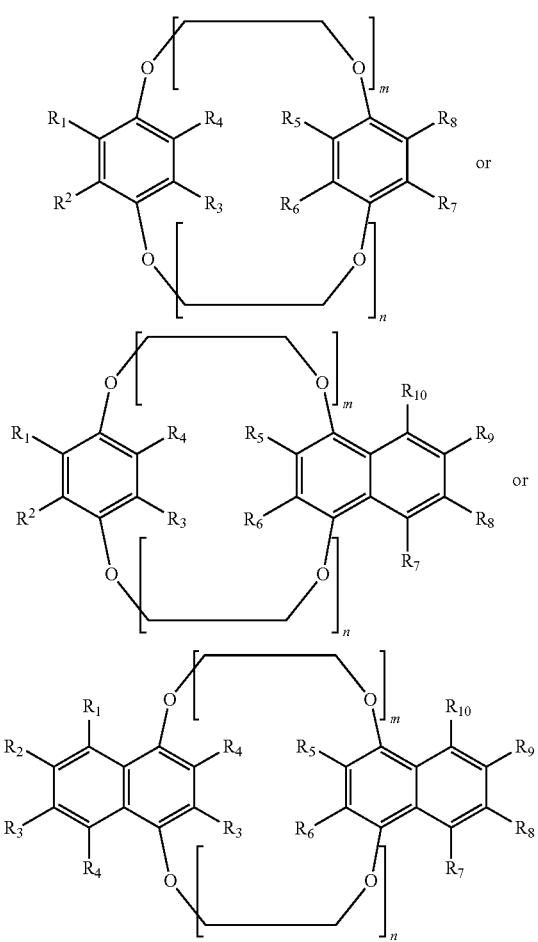

where in each case: n and m are each independently selected from 3, 4 and 5, and $R_1$, $R_2$, $R_3$, $R_4$, $R_5$, $R_6$, $R_7$, $R_8$, $R_9$, $R_{10}$, $R_{11}$, and $R_{12}$ are each independently selected from H, $CH_3$, $C_2H_5$, $C_3H_7$, $C_4H_9$, $C_5H_{11}$, $C_6H_{13}$, isobutyl, $CF_3$, $C_2F_5$, $C_3F_7$, $C_4F_9$, $C_5F_{11}$, $C_6F_{13}$, OH, O—$CH_3$, $CH_2$—O—$CH_3$, $CH_2$—O—$CH_2$—$CH_3$, CN, phenyl, thiophene.

In one embodiment of the invention, the crown ethers have the following general formula (II):

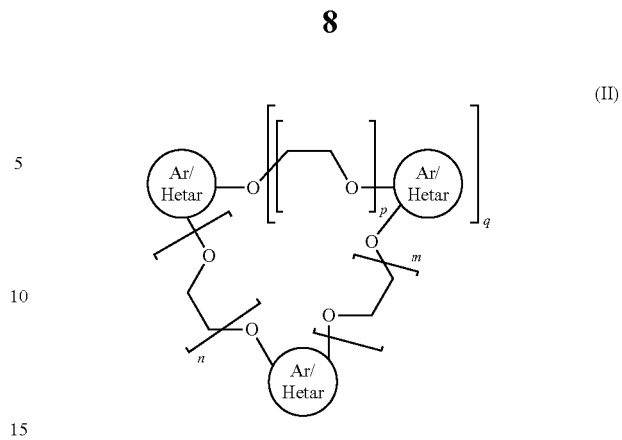

with Ar=phenyl, naphthyl, biphenyl, triphenyl, naphthyl, binaphthyl, 3-6 fused phenyl rings, anthracenyl, phenanthrenyl, pyrenyl, Hetar=thiophene, pyrrole, furan, thienothiopnenes, oxazole, thiazole, oxadiazole, thiadiazole, triazole, pyridine, pyrimidine, pyrazine, benzothiophenes, benzopyrrole, benzofuran, benzothiophene, benzopyrrole, benzofuran, benzoxazole, benzothiazole, thienothiopnenes, thienopyrrole, thienofuran, 3-6 fused heterocycles, dithienothiophene, dithienopyrrole, dithienobenzene, dithienocyclopentadienes, dipyrrolobenzene, ether bridges joined in 1,2, 1,3 and 1,4 positions on the particular phenyl ring (ortho, meta and para positions), naphthyl ring, fused phenyl ring, and heteroaryl ring and fused heteroaryl ring, m and n are each independently 1, 2, 3, 4, 5, 6, p and q are each independently 1, 2, 3, 4, 5, 6, Particular preference is given to compounds having the following structures:

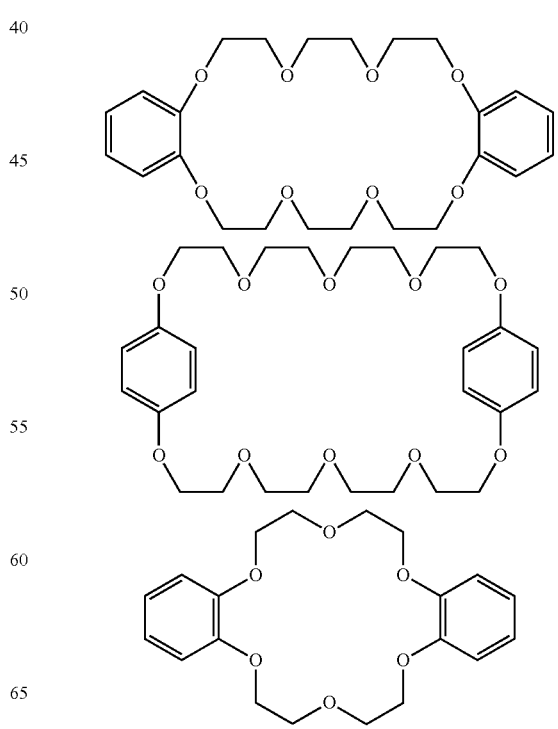

-continued
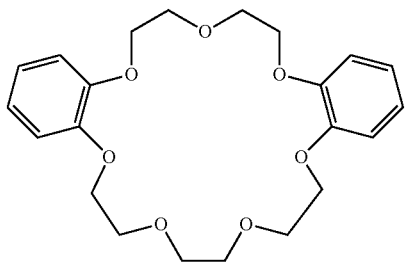
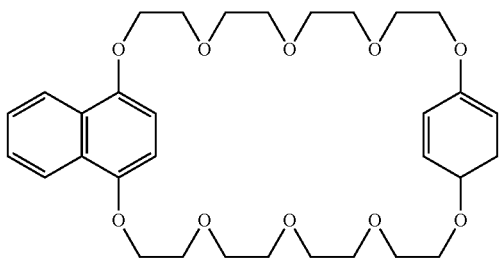
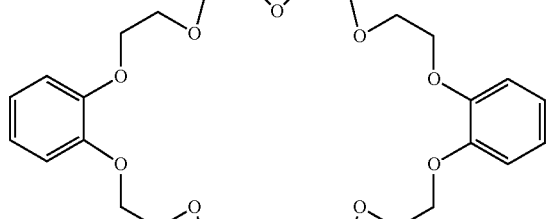
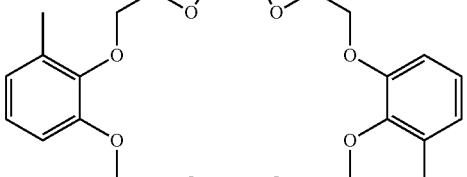
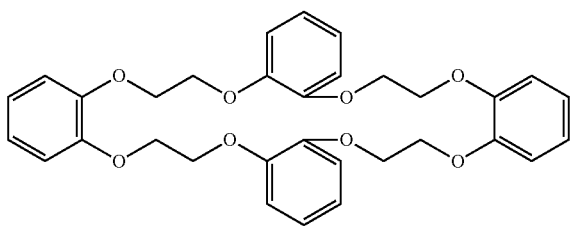
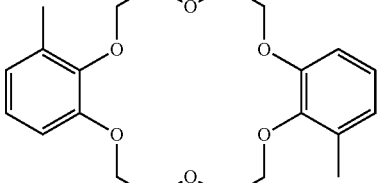
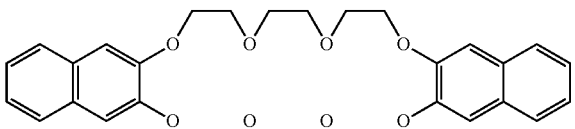
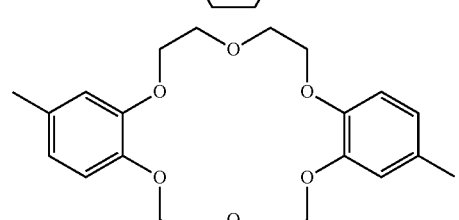
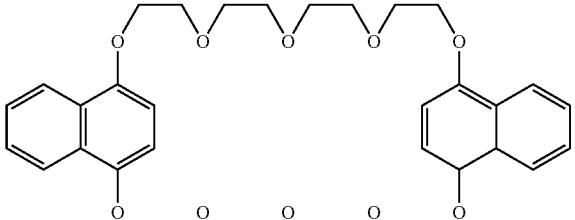
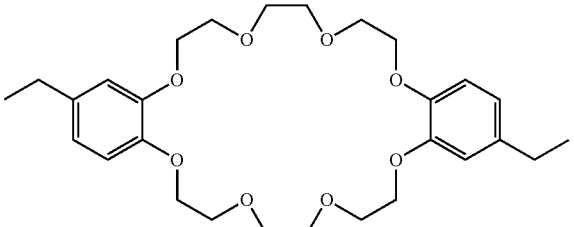
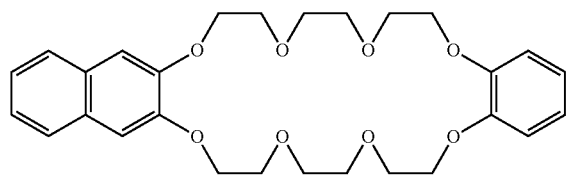
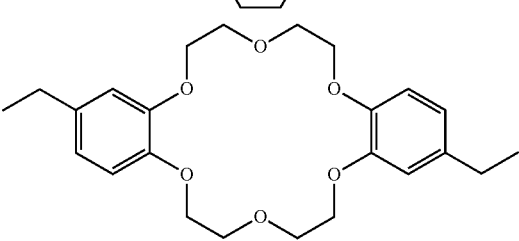

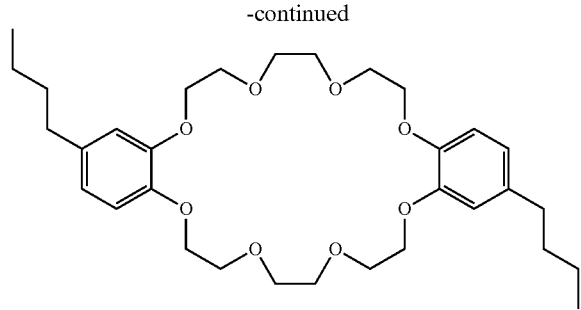
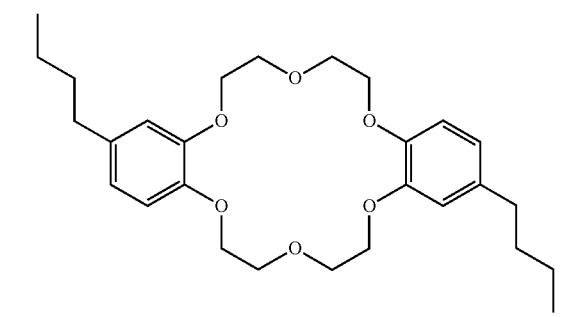
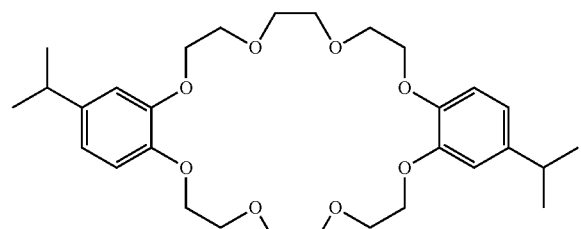
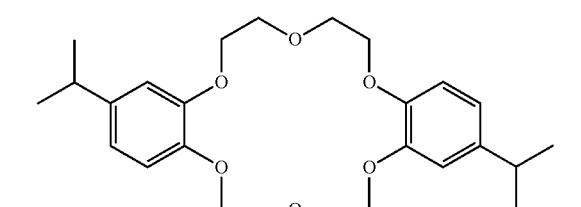
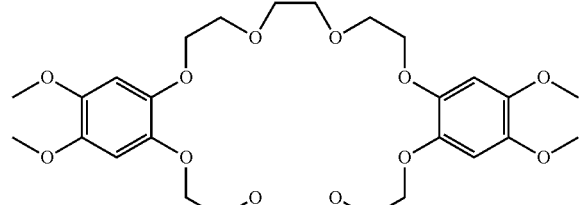
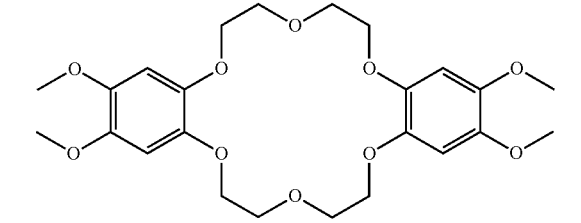
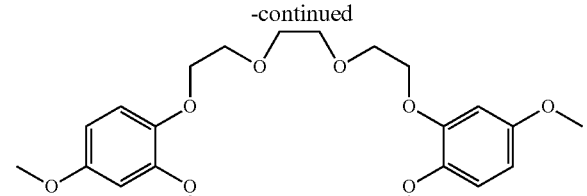

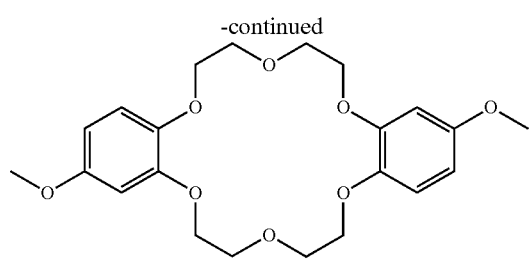
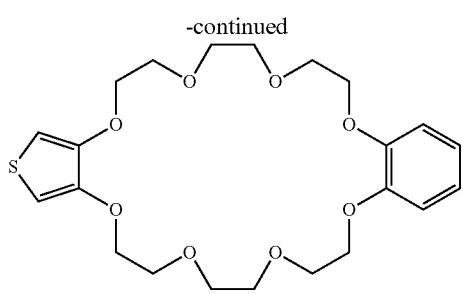
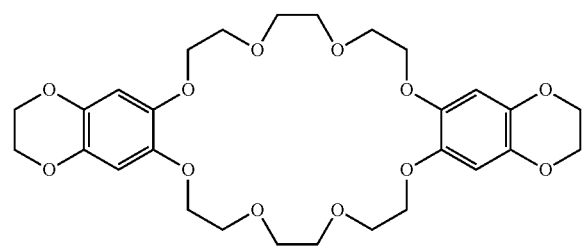
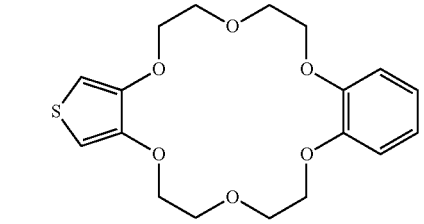
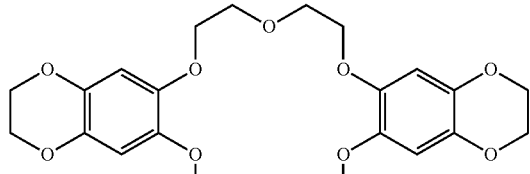
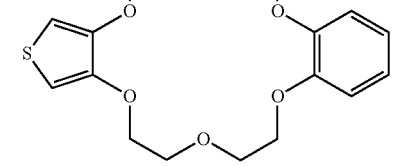
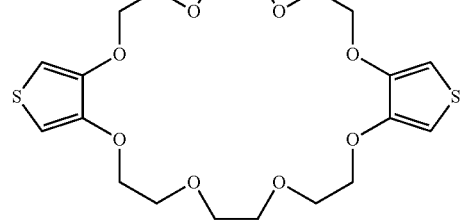
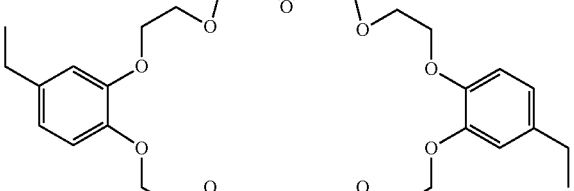
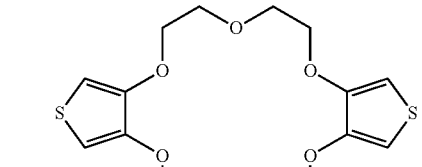
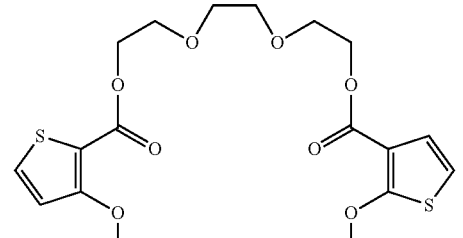
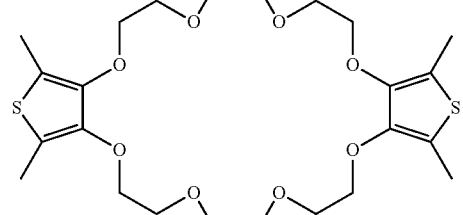
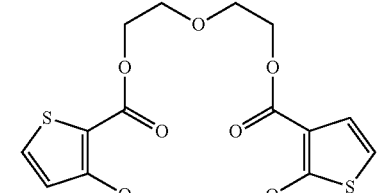
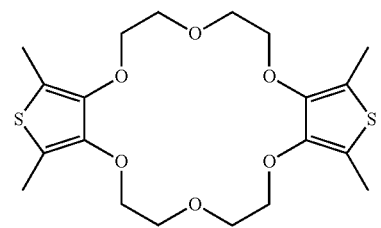
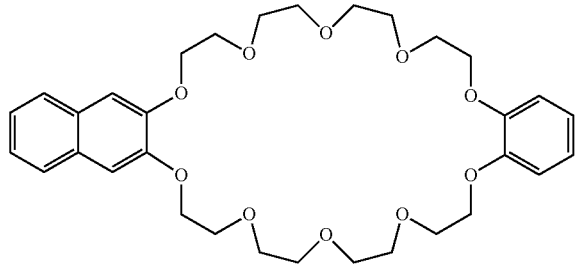

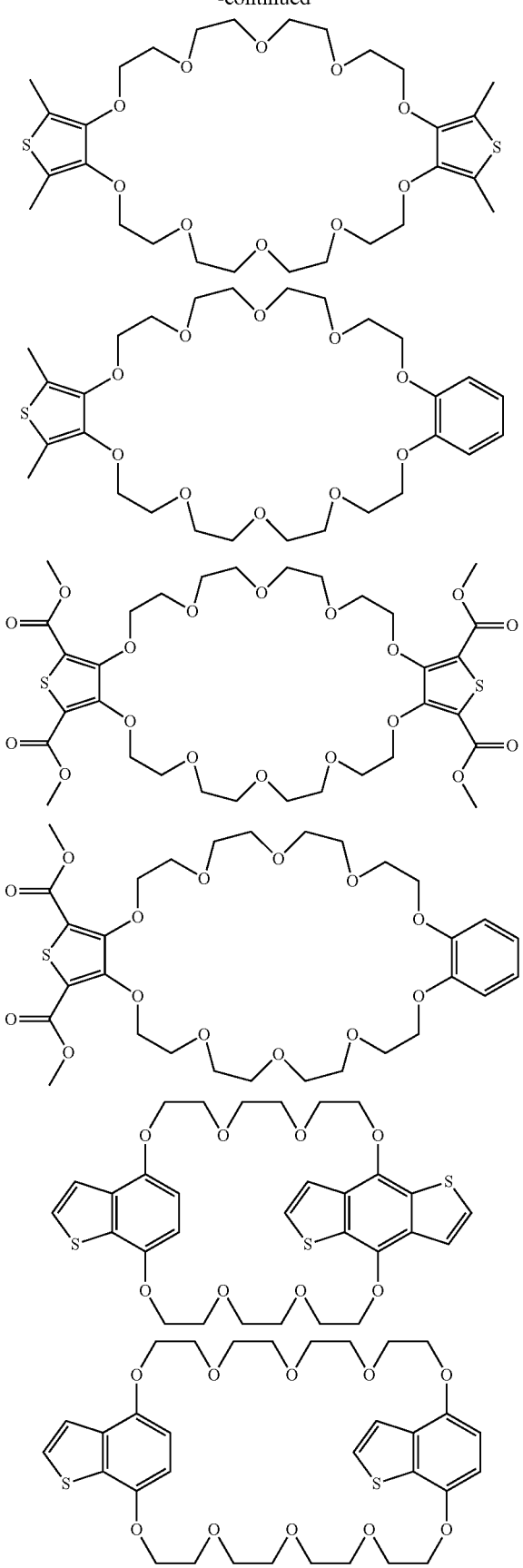
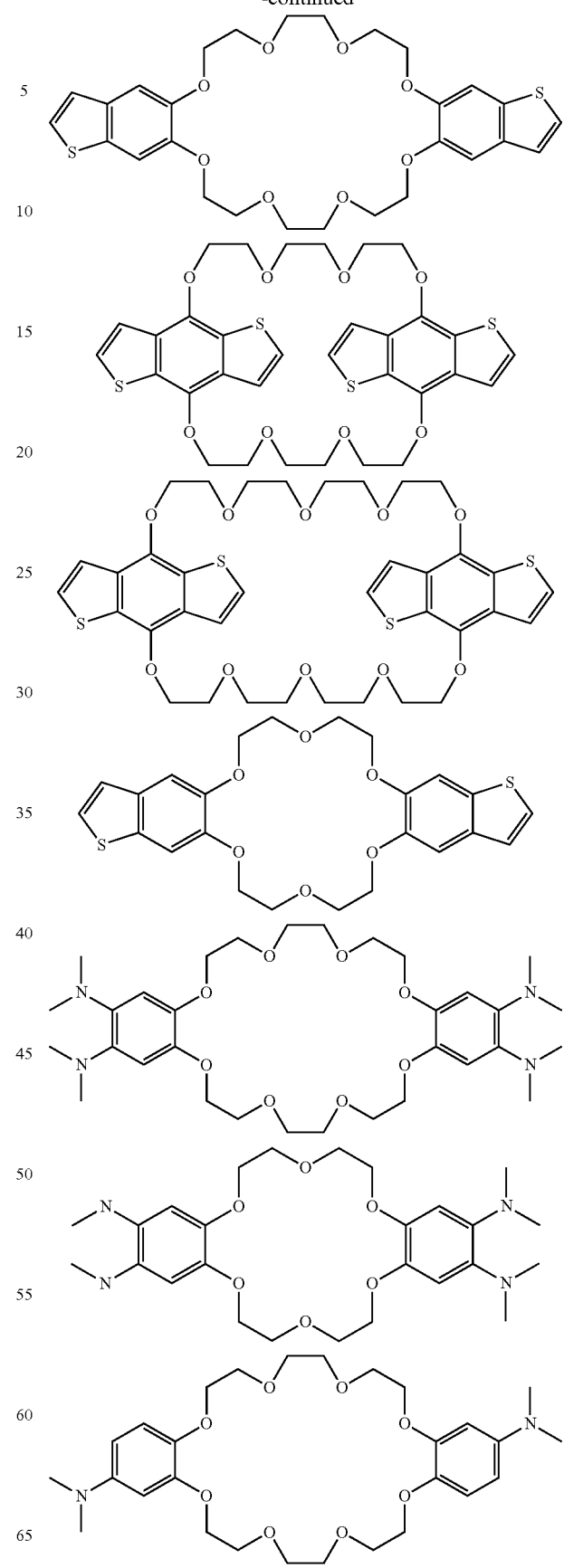

-continued

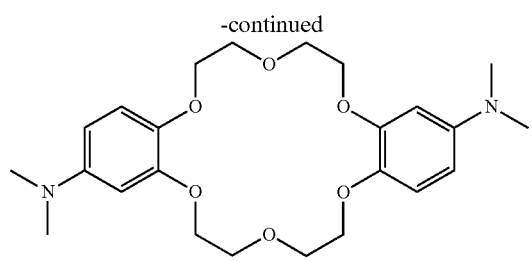

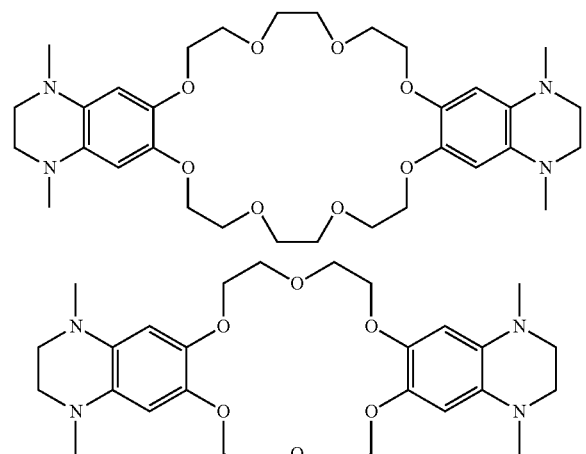

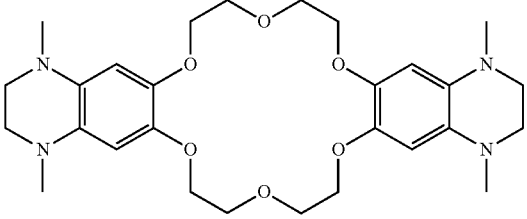

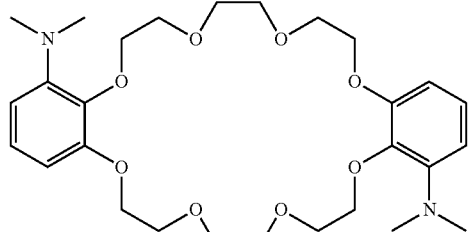

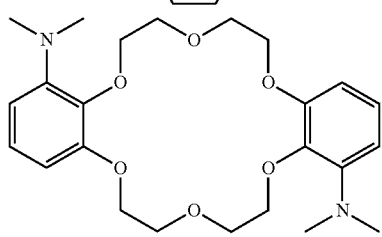

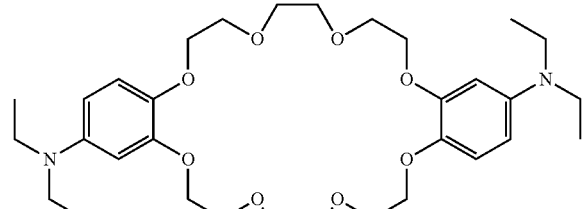

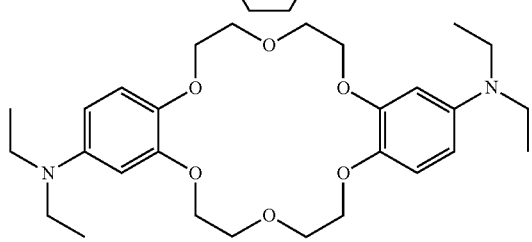

-continued

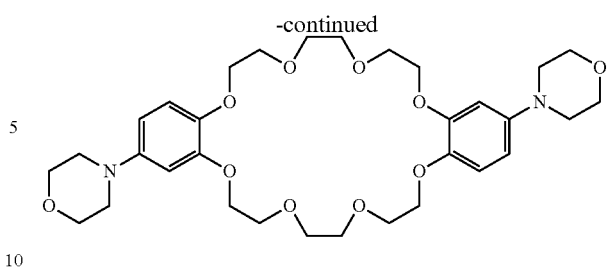

In one embodiment of the invention, the crown ethers are selected from a group consisting of aryl and heteroaryl crown ethers and fused aryl and fused heteroaryl crown ethers, preferably diaryl and diheteroaryl crown ethers and mixed aryl and heteroaryl crown ethers, more preferably dibenzo-crown ethers, dinaphtho-crown ethers and mixed benzo-naphtho-crown ethers. An aryl crown ether consists of at least one aryl group, but may also have a bi-, tri- and polycyclic aromatic hydrocarbyl group. Two carbon atoms of the aryl base skeleton therein are joined to form a ring with monoethoxy, diethoxy, triethoxy, tetraethoxy, pentaethoxy and hexaethoxy groups. A fused aryl crown ether consists of at least one bicyclic aromatic hydrocarbyl group, but may also have a tri- and polycyclic aromatic hydrocarbyl group. Two carbon atoms of the fused base skeleton therein are joined to form a ring with monoethoxy, diethoxy, triethoxy, tetraethoxy, pentaethoxy and hexaethoxy groups. A fused heteroaryl crown ether consists of at least one heteroaryl ring with at least one benzene ring or a further heteroaryl ring fused thereto, but may also have a tri- and polycyclic heteroaromatic hydrocarbyl group. Two carbon atoms of the fused base skeleton therein are joined to form a ring with monoethoxy, diethoxy, triethoxy, tetraethoxy, pentaethoxy and hexaethoxy groups. A diaryl crown ether consists of two non-fused (separate) aryl groups joined to one another via alkoxy bridges in the form of a crown. These alkoxy units consist of one to six ethoxy groups. A fused diaryl crown ether consists of two fused aryl groups joined to one another via two alkoxy bridges in the form of a crown. These alkoxy units consist of one to six ethoxy groups. A fused diheteroaryl crown ether consists of two fused heteroaryl groups joined to one another via two alkoxy bridges in the form of a crown. These alkoxy units consist of one to six ethoxy groups. An aryl-heteroaryl crown ether consists both of an aryl group and of a heteroaryl group joined to one another via two alkoxy bridges in the form of a crown. These alkoxy units consist of one to six ethoxy groups.

In a further embodiment of the invention, the third material is a sorbitol. Preference is given to compounds having the following structures:

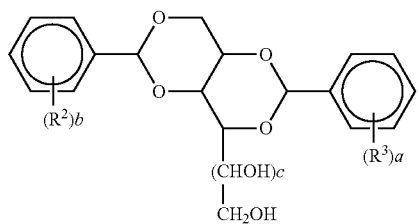

where R1 and R2 are each independently selected from H, CH$_3$, C$_2$H$_5$ and

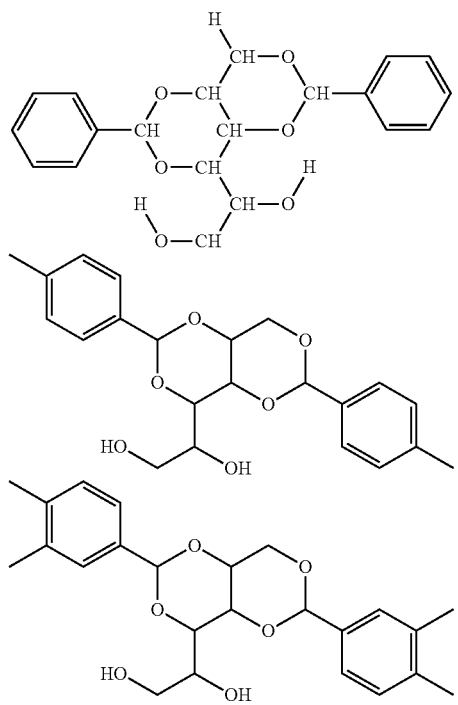

In a further embodiment of the invention, the third material is a quinacridone. Preference is given to compounds having the following structures:

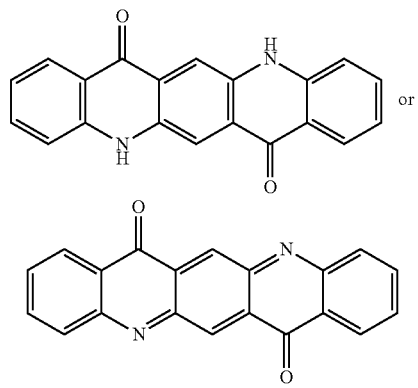

In a further embodiment of the invention, the third material is bis(4-tert-butyl) benzoato-O) hydroxyaluminum having the following structure:

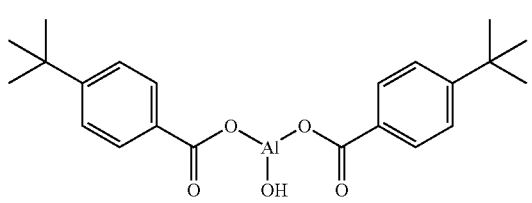

In a further embodiment of the invention, the third material is a triphenyl having the following structure:

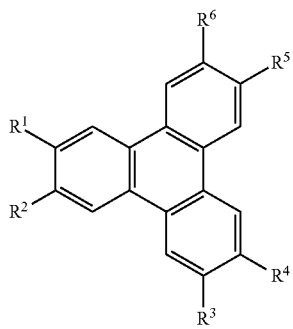

where R1 to R6 are each independently selected from H, OH, OCH$_3$, OOCH$_3$, where at least three oxygens are present in the molecule.

Preference is given to compounds having the following structures:

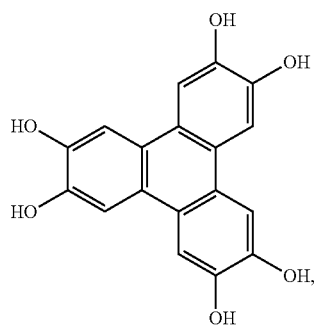

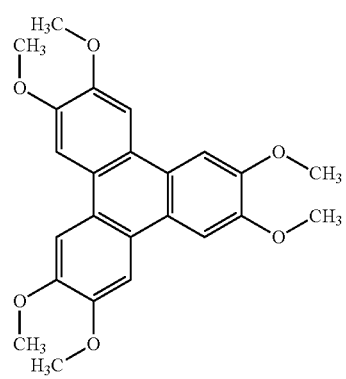

-continued

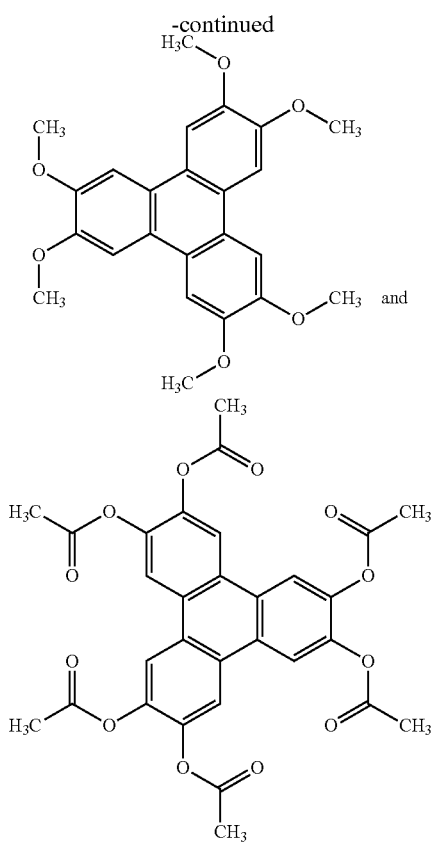
and

Preferred developments of the invention are apparent from the combinations of the claims or individual features thereof.

BRIEF DESCRIPTION OF THE DRAWING FIGURES

Figure 2:
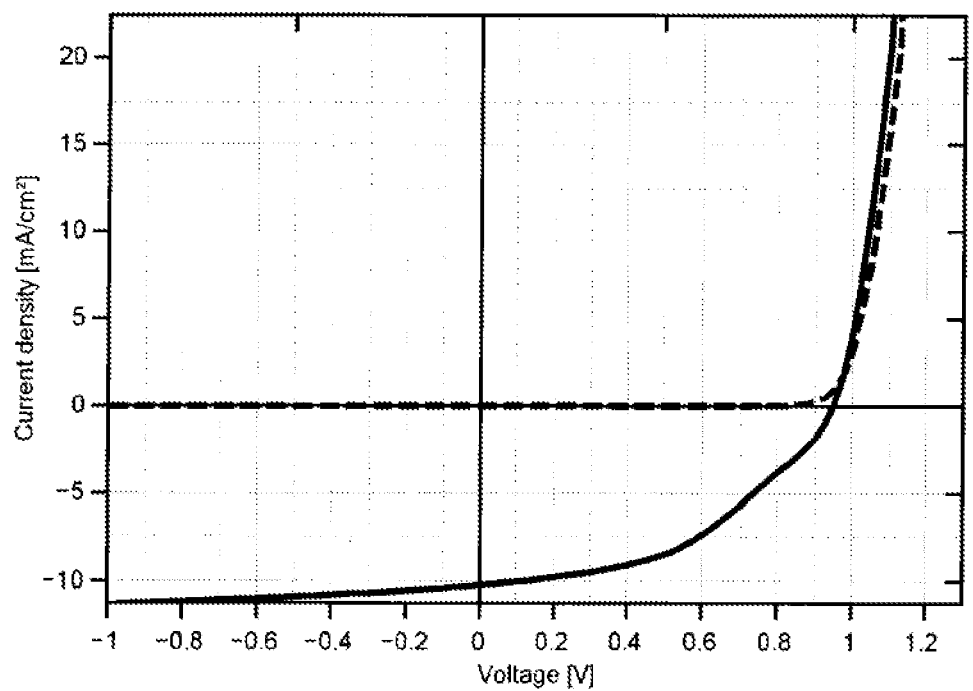
Figure 3:
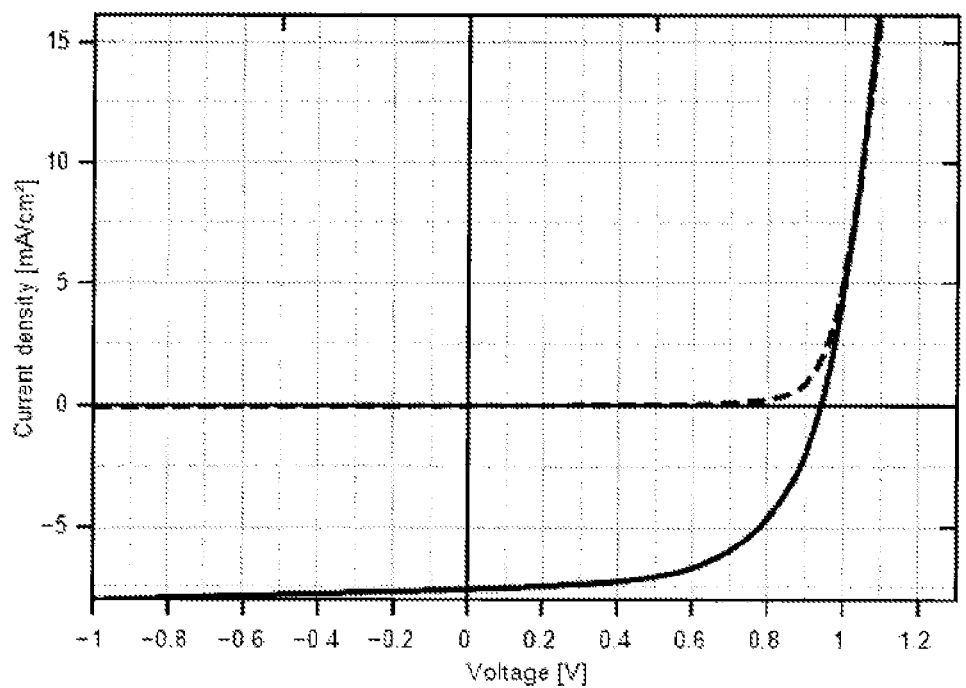
Figure 4:
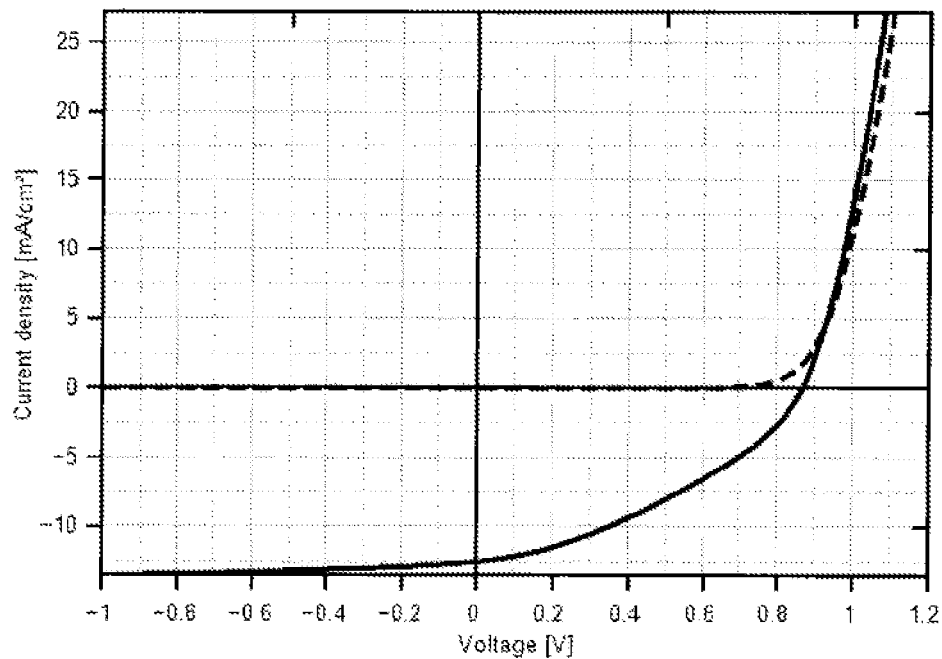
Figure 5:
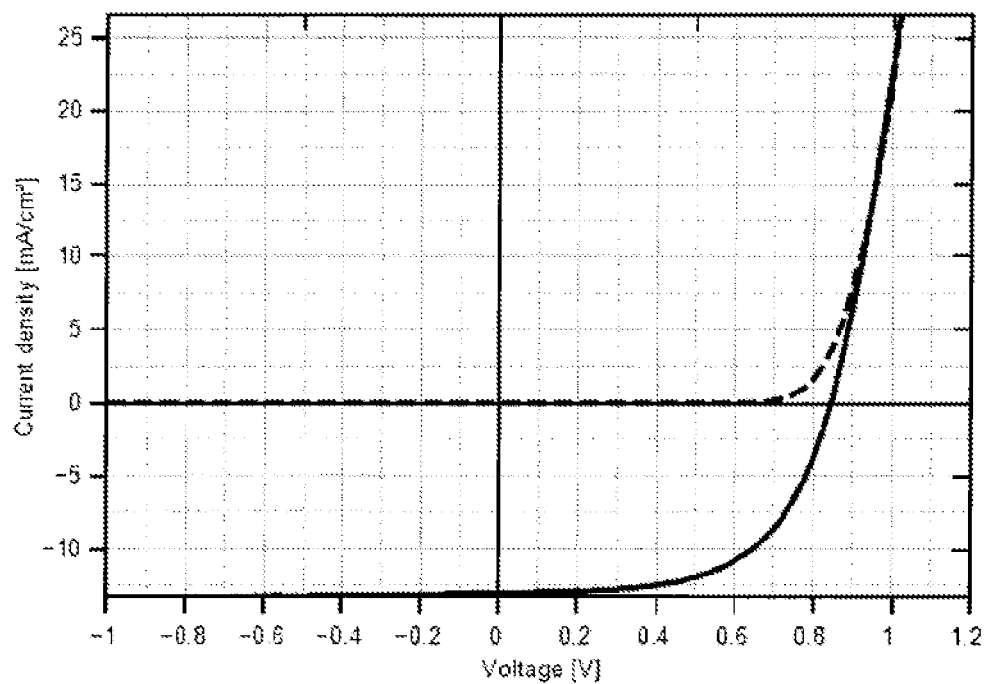
Figure 6:
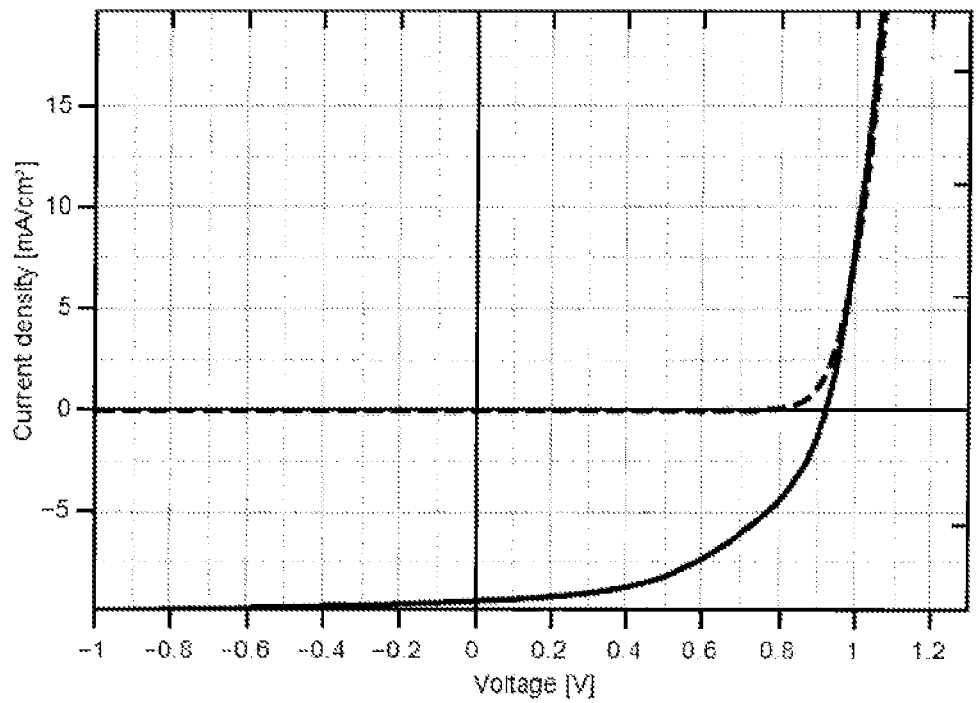
Figure 7:
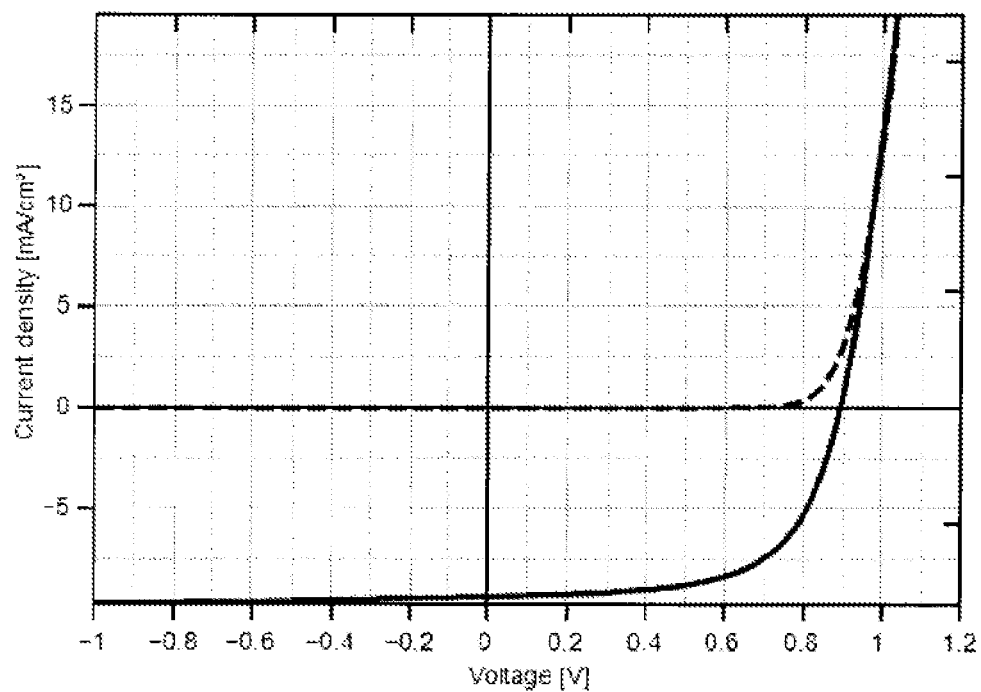
Figure 8:
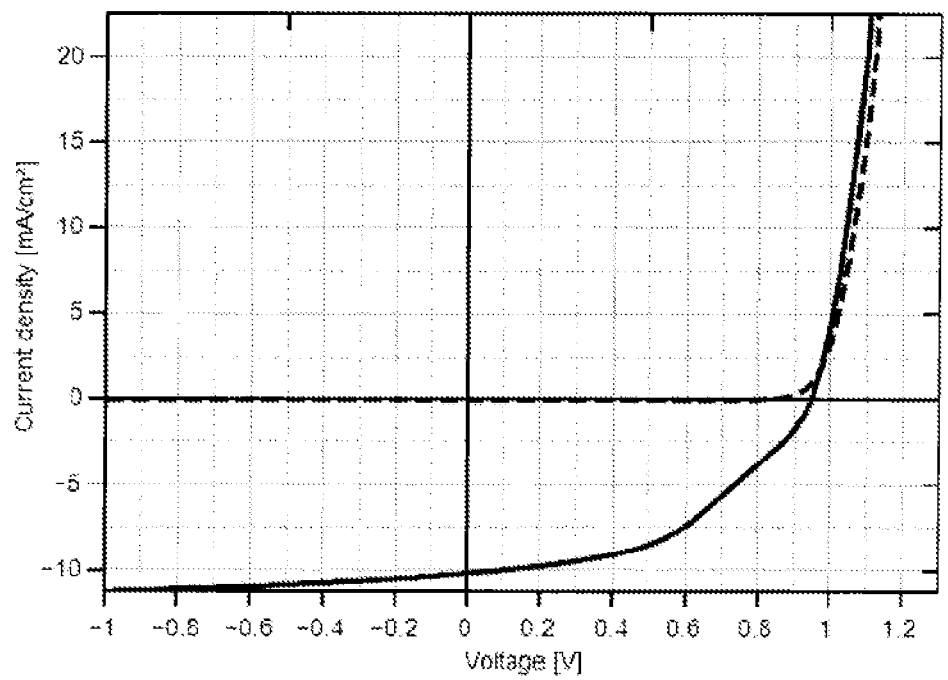
Figure 9:
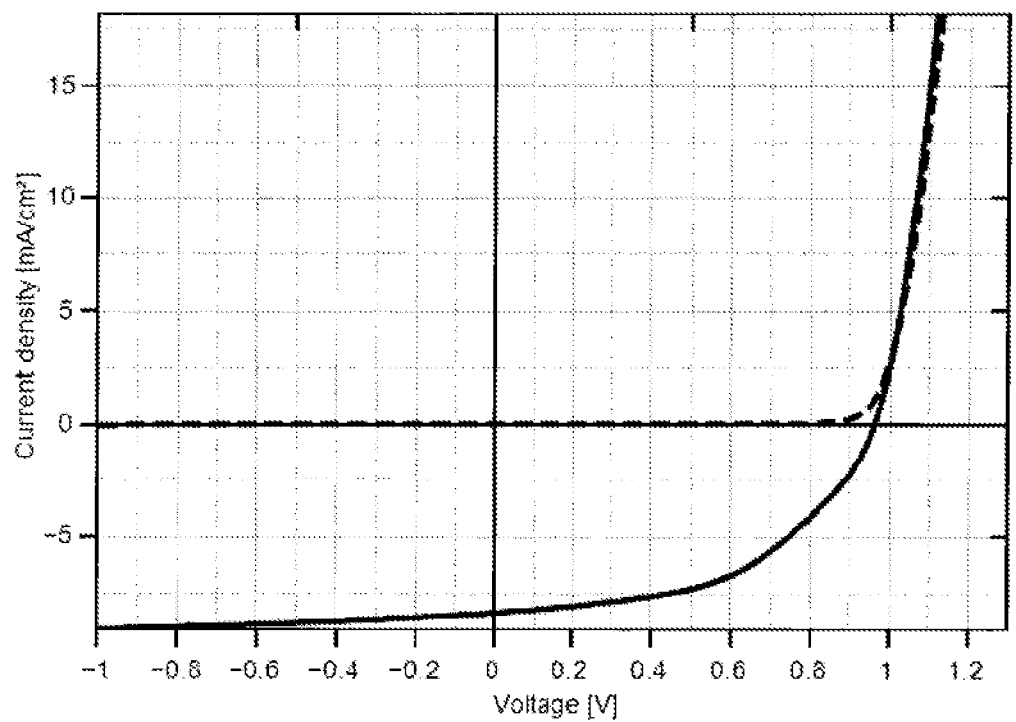
Figure 10:
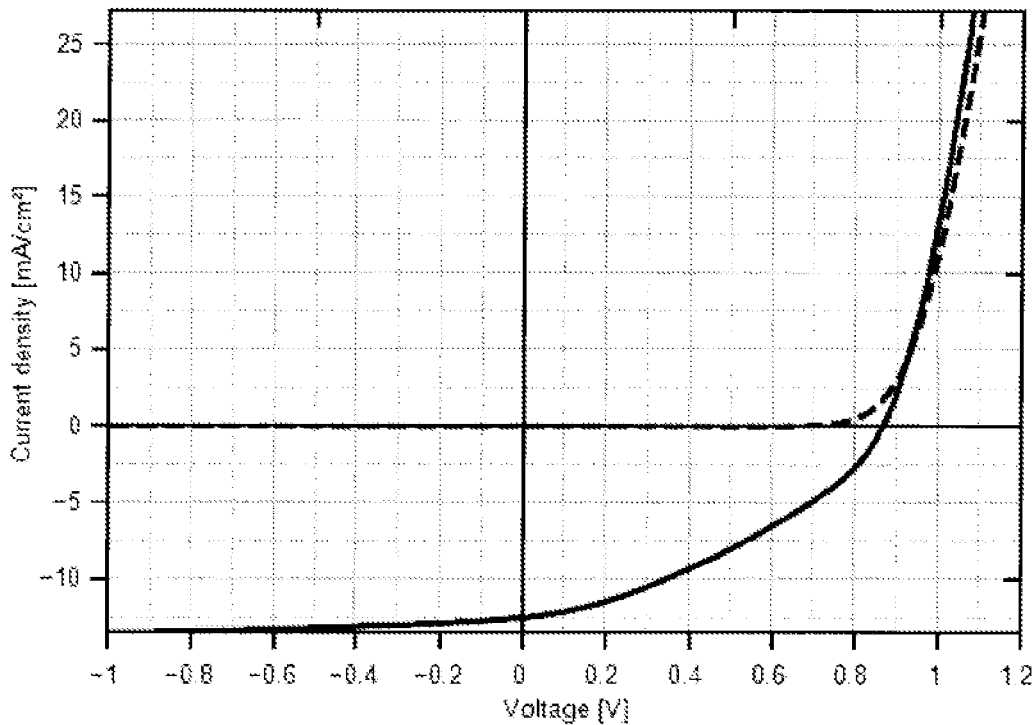
Figure 11:
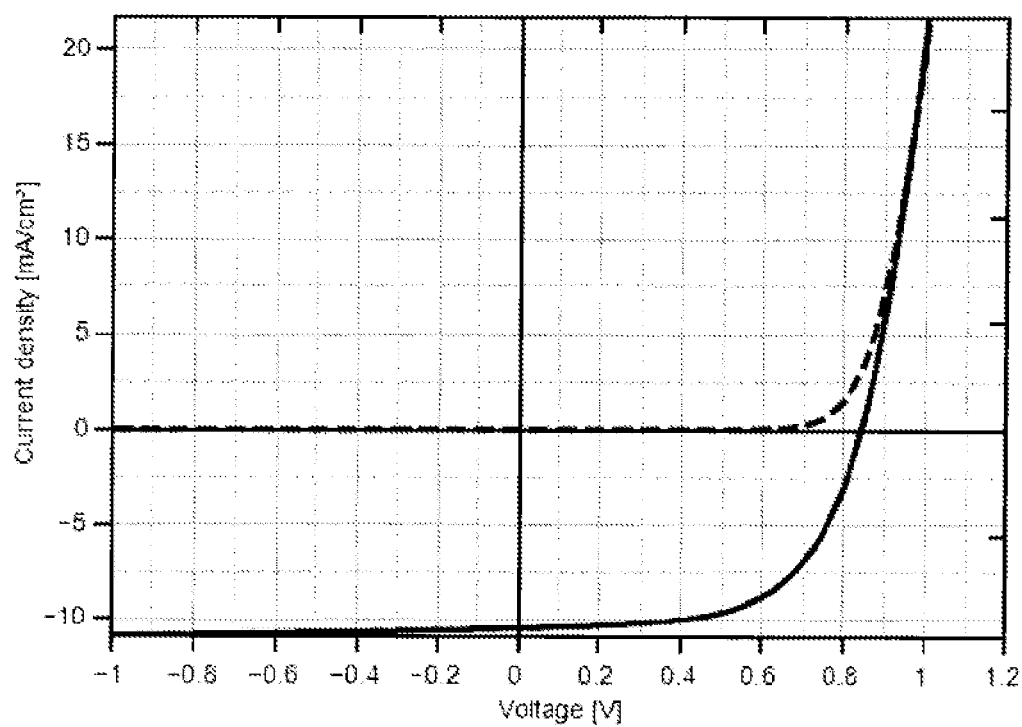
Figure 12:
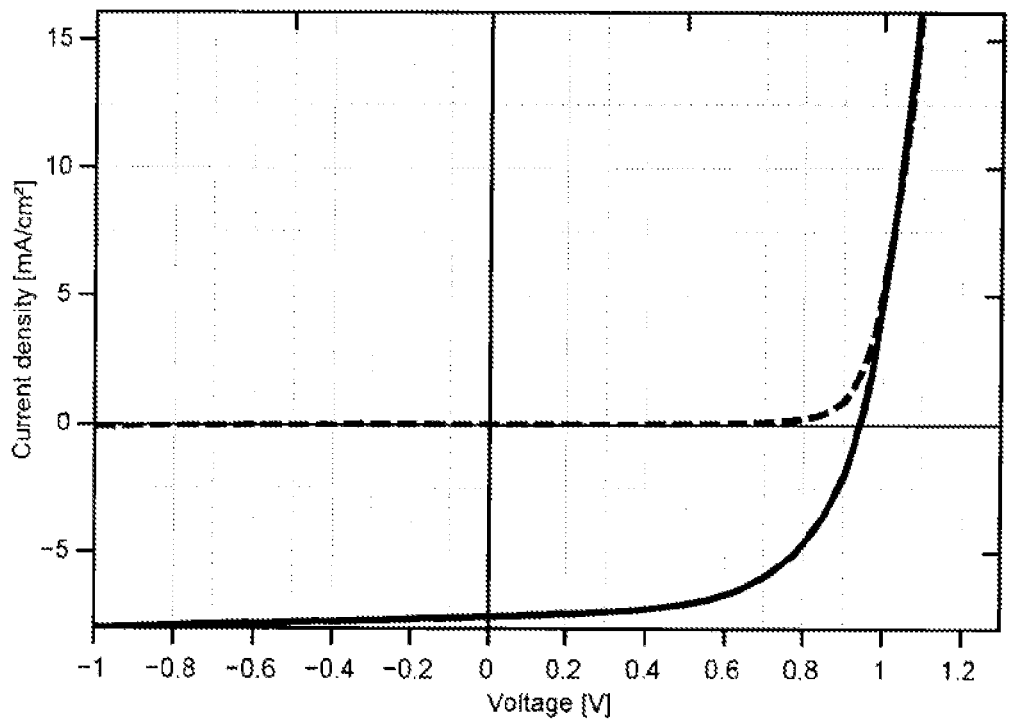
Figure 13:
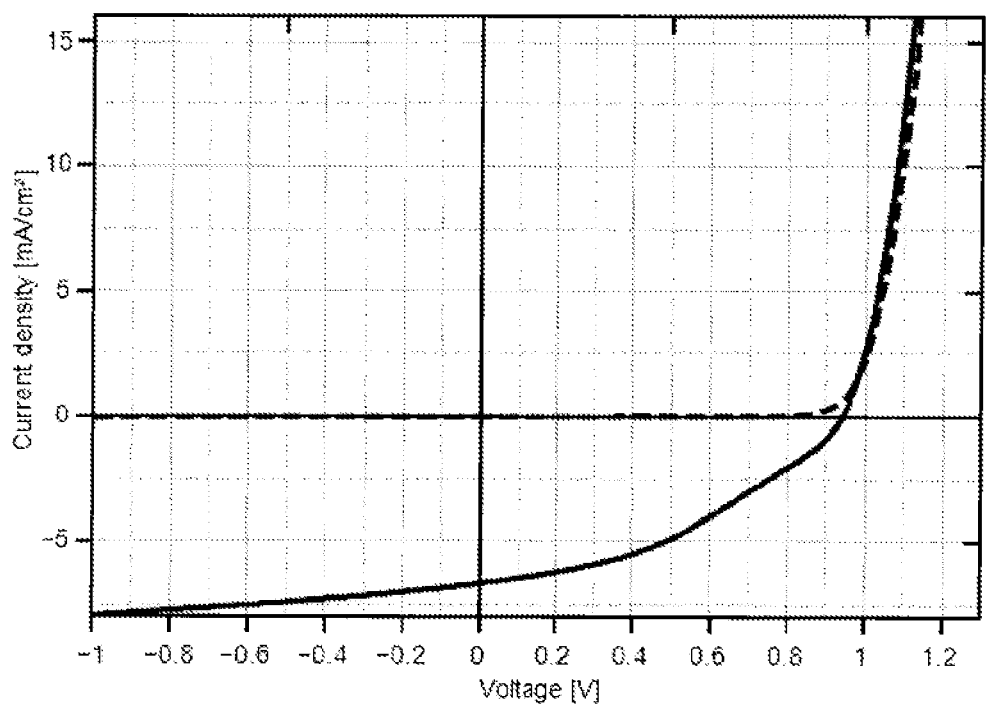
Figure 14:
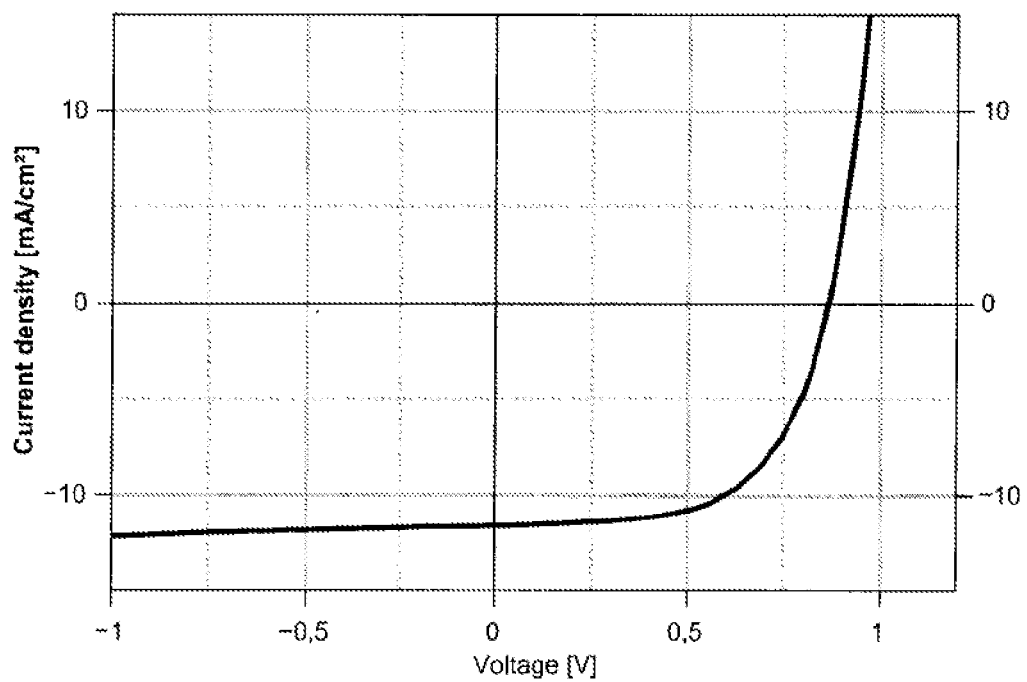
Figure 15:
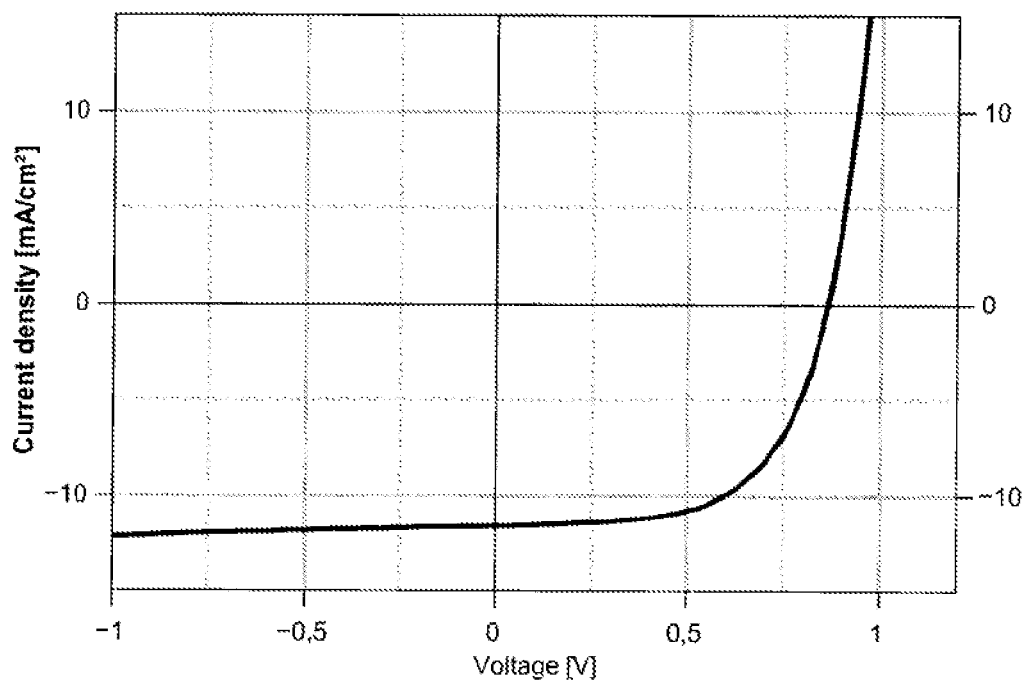
Figure 16:
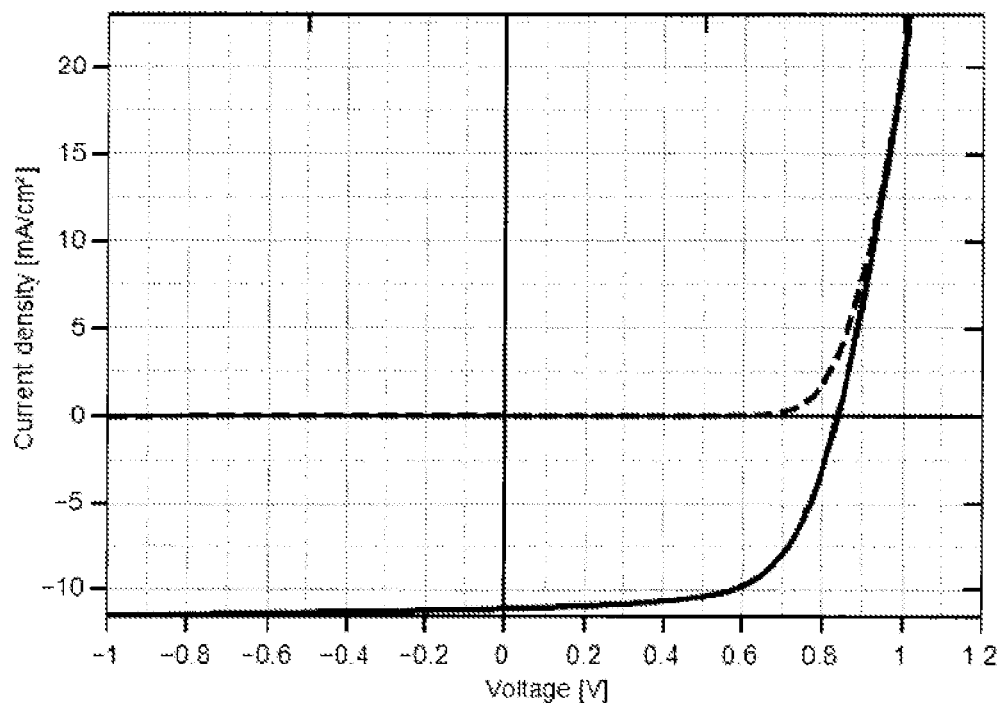
Figure 17:
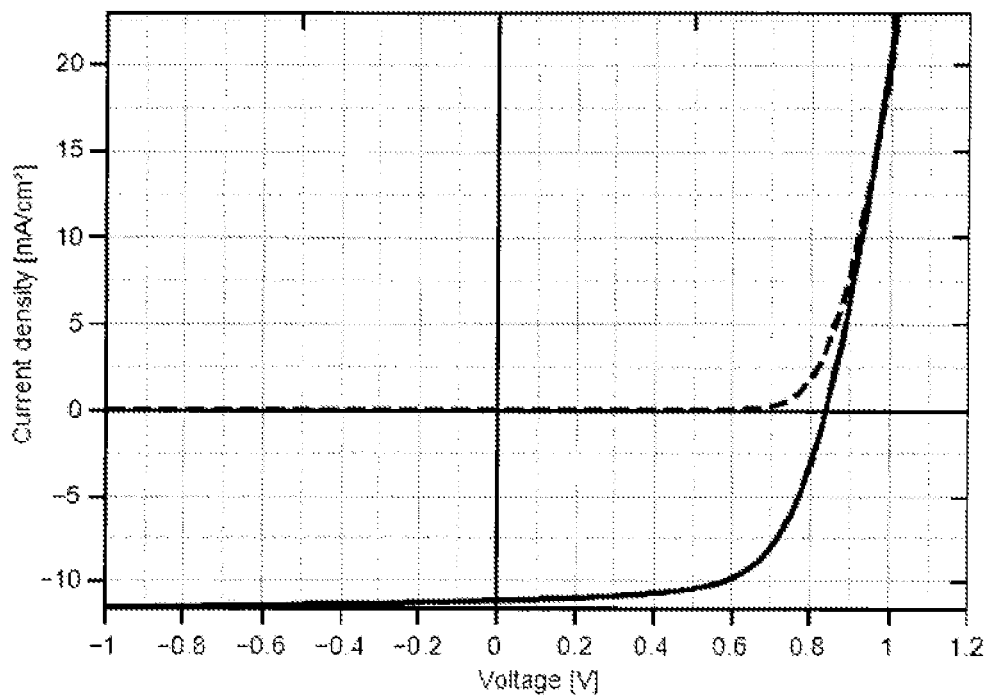

The invention is to be illustrated in detail hereinafter with reference to some working examples and figures. The working examples are intended to describe the invention without restricting it. The figures show:

FIG. 1 a schematic diagram of an inventive component,

FIG. 2 a current-voltage characteristic of a comparative component having two materials in the photoactive layer, FIG. 3 a current-voltage characteristic of a component having the same layer structure as shown in FIG. 2, but with three materials in the photoactive layer, using compound (I) as the third material, FIG. 4 a current-voltage characteristic of a comparative component having two materials in the photoactive layer, FIG. 5 a current-voltage characteristic of a component having the same layer structure as shown in FIG. 4, but with three materials in the photoactive layer, using compound (I) as the third material, FIG. 6 a current-voltage characteristic of a comparative component having two materials in the photoactive layer, FIG. 7 a current-voltage characteristic of a component having the same layer structure as shown in FIG. 6, but with three materials in the photoactive layer, using compound (I) as the third material, FIG. 8 a current-voltage characteristic of a comparative component having two materials in the photoactive layer, FIG. 9 a current-voltage characteristic of a component having the same layer structure as shown in FIG. 8, but with three materials in the photoactive layer, using compound (II) as the third material, FIG. 10 a current-voltage characteristic of a comparative component having two materials in the photoactive layer, FIG. 11 a current-voltage characteristic of a component having the same layer structure as shown in FIG. 10, but with three materials in the photoactive layer, using compound (V) as the third material, FIG. 12 a current-voltage characteristic of a comparative component having two materials in the photoactive layer, FIG. 13 a current-voltage characteristic of a component having the same layer structure as shown in FIG. 12, but with three materials in the photoactive layer, using compound (VI) as the third material, FIG. 14 a current-voltage characteristic of a comparative component having two materials in the photoactive layer, deposited at substrate temperature 70° C., FIG. 15 a current-voltage characteristic of a component having the same layer structure as shown in FIG. 14, but with three materials in the photoactive layer, using compound (III) as the third material and with deposition at room temperature, FIG. 16 a current-voltage characteristic of a comparative component having two materials in the photoactive layer, deposited at substrate temperature 70° C., and FIG. 17 a current-voltage characteristic of a component having the same layer structure as shown in FIG. 16, but with three materials in the photoactive layer, using compound (I) as the third material and with deposition at room temperature.

Figure 18:
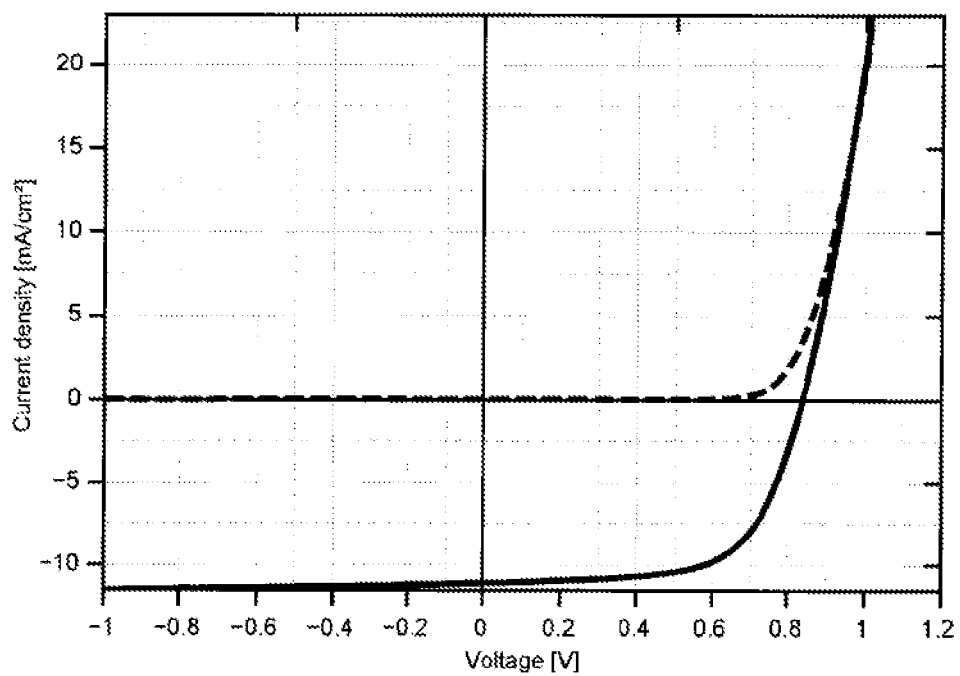
Figure 19:
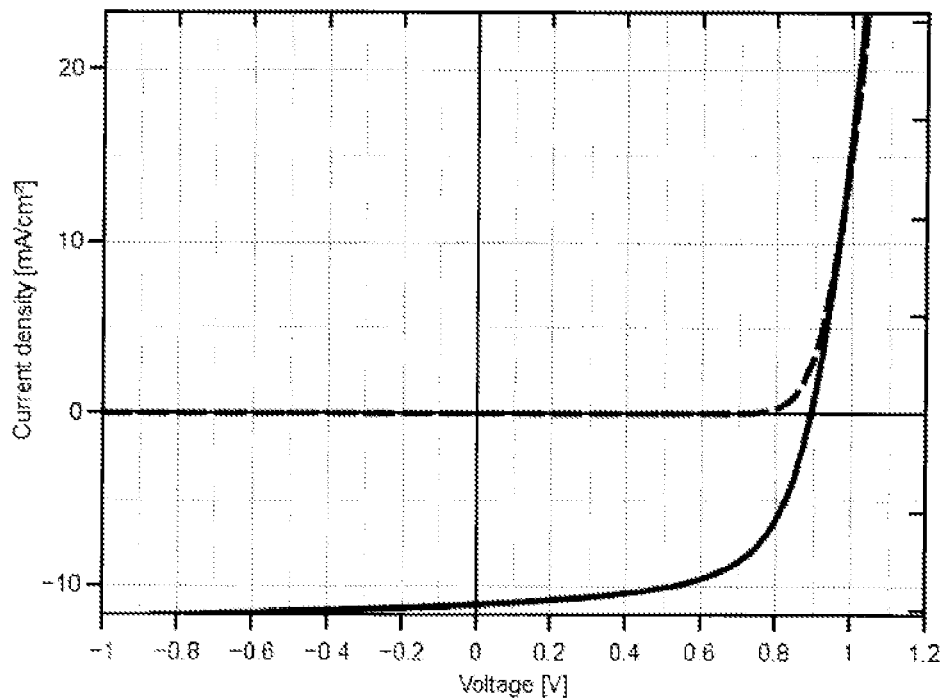
Figure 20:
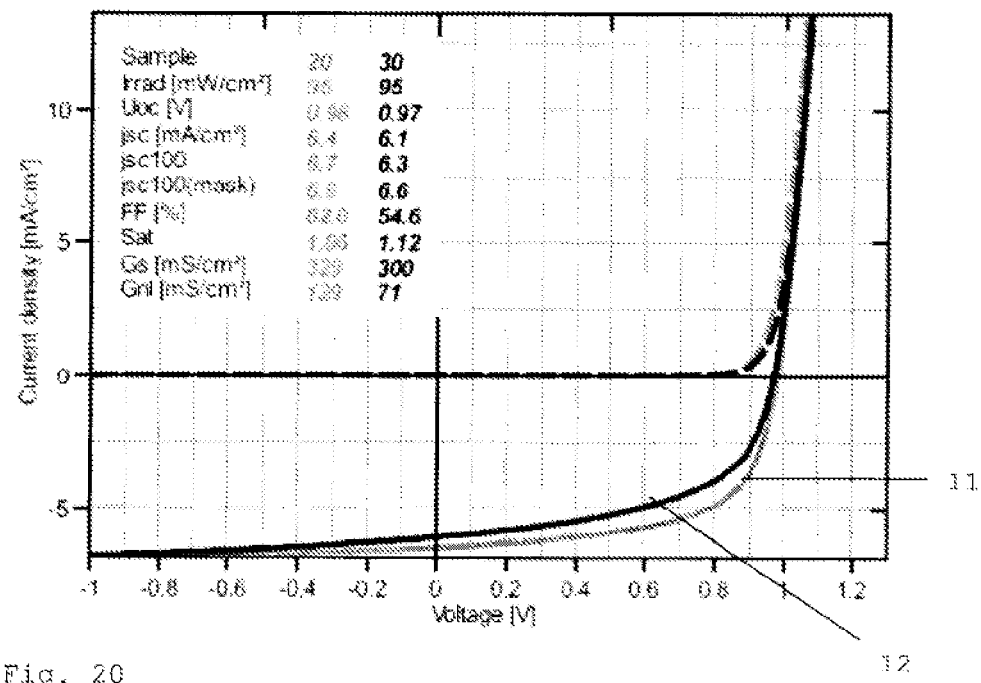
Figure 21:
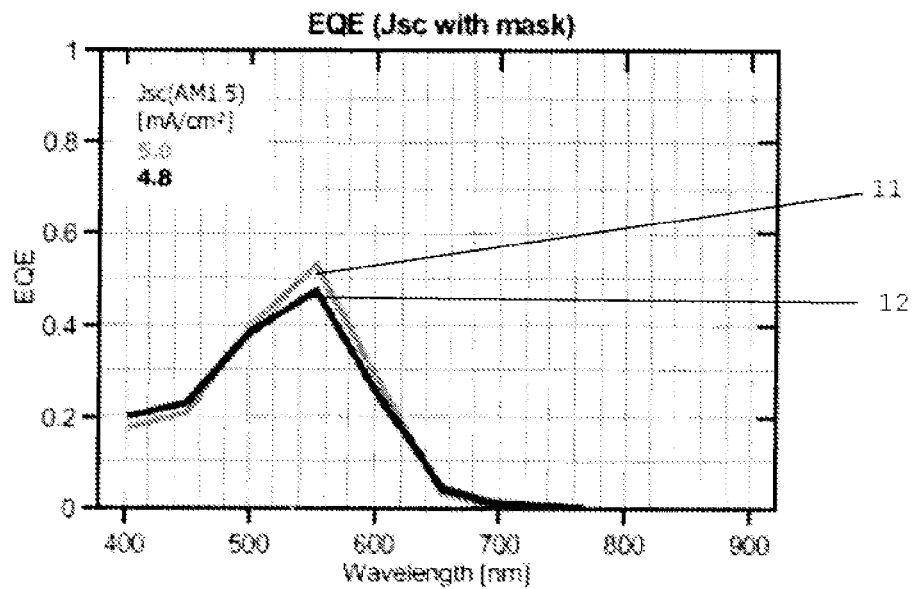
Figure 22:
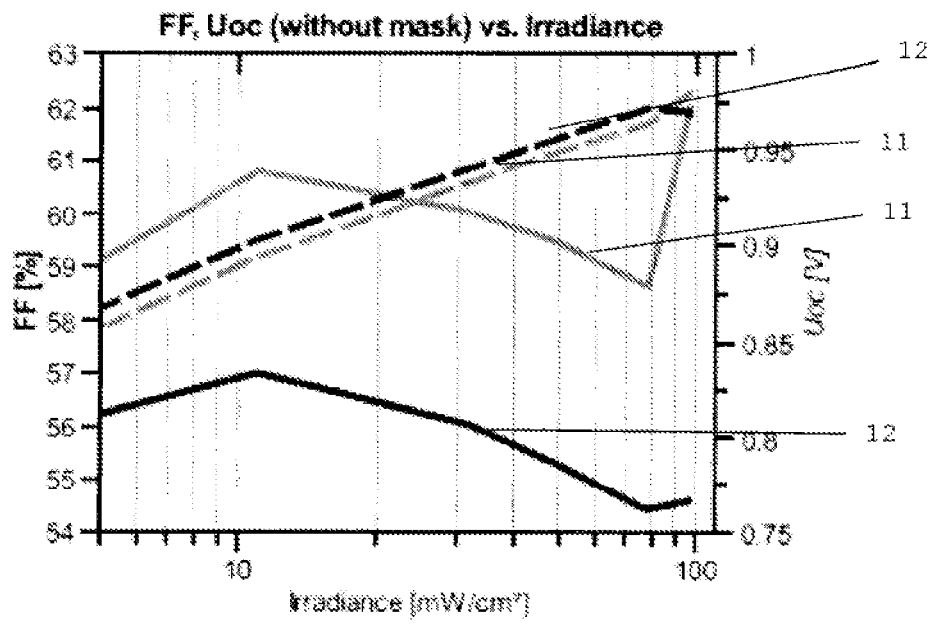
Figure 23:
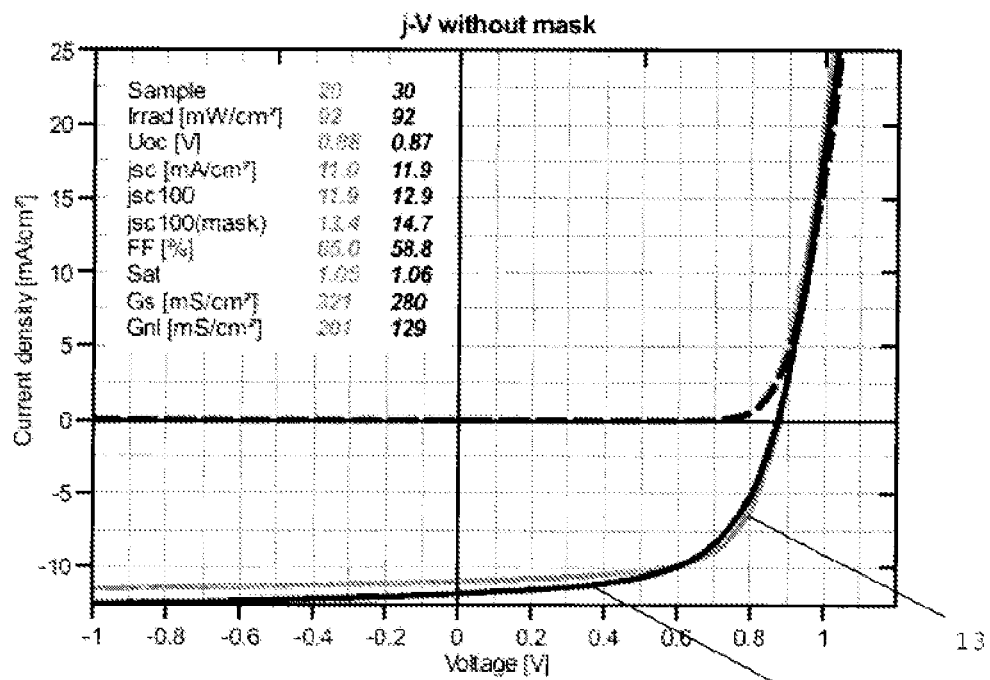
Figure 24:
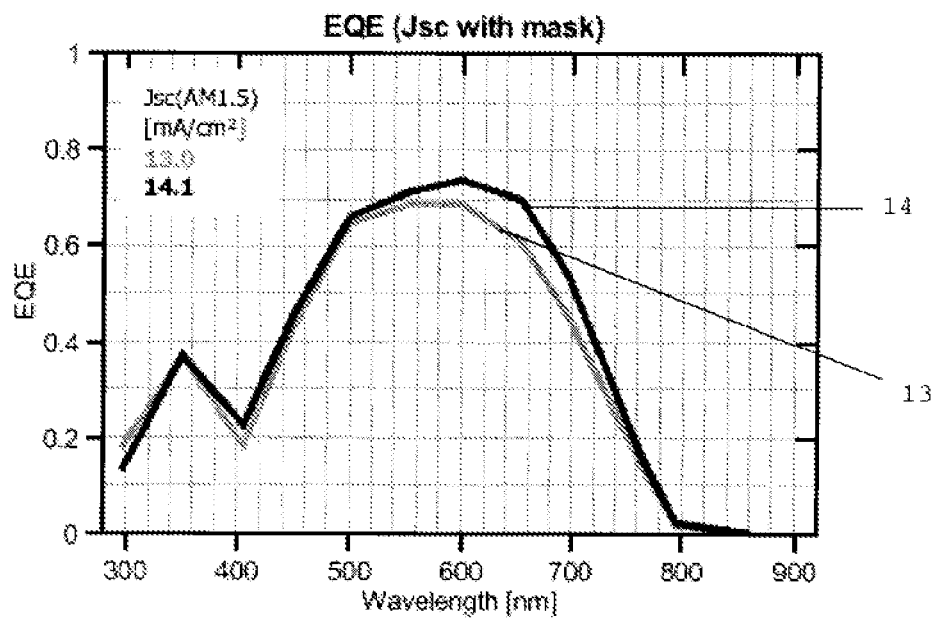
Figure 25:
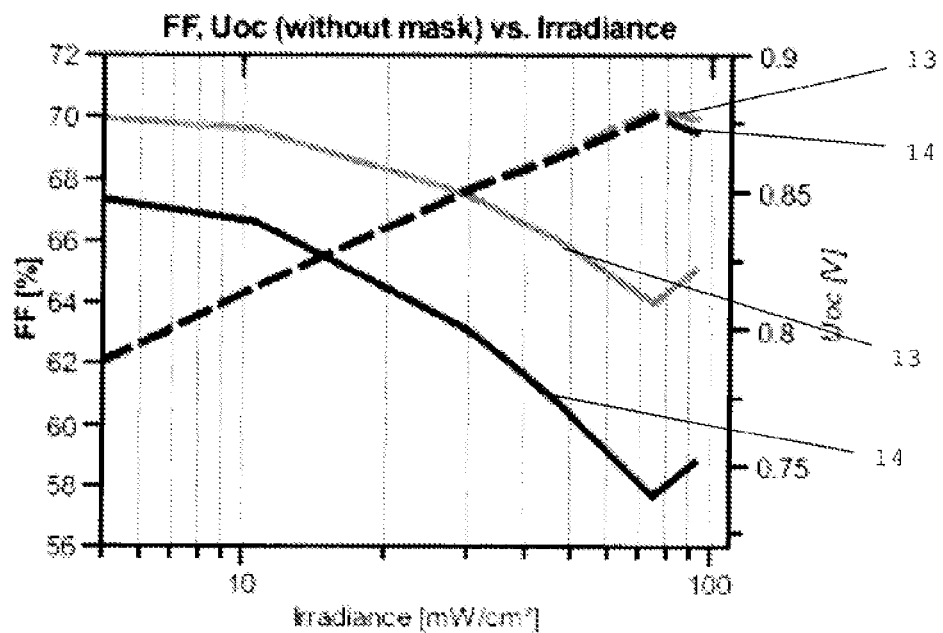
Figure 26:
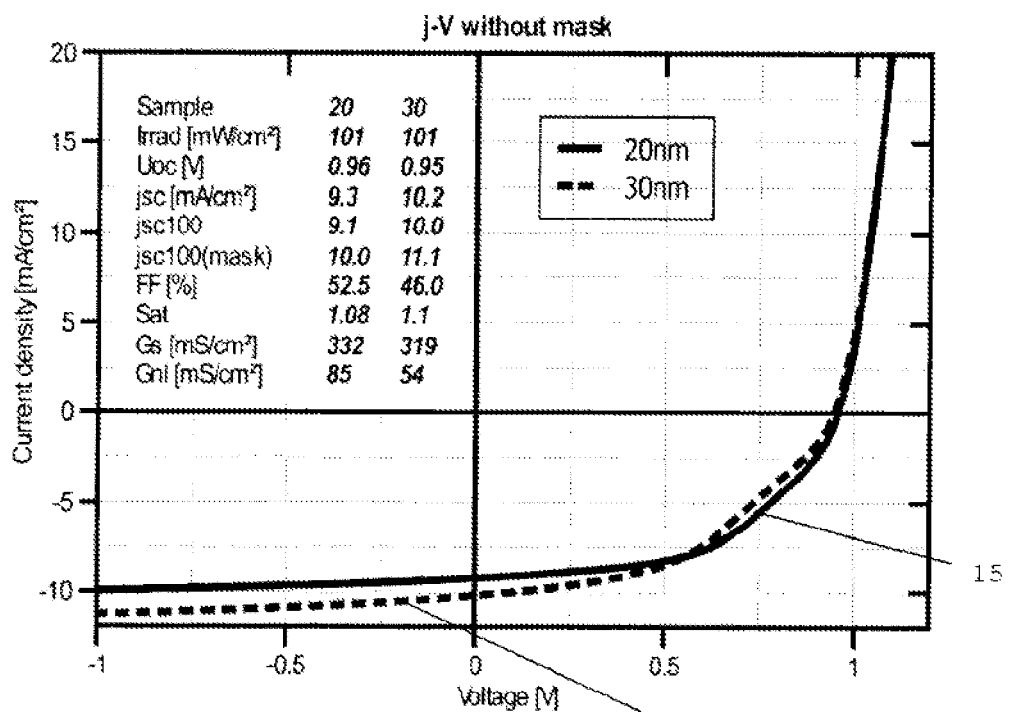
Figure 27:
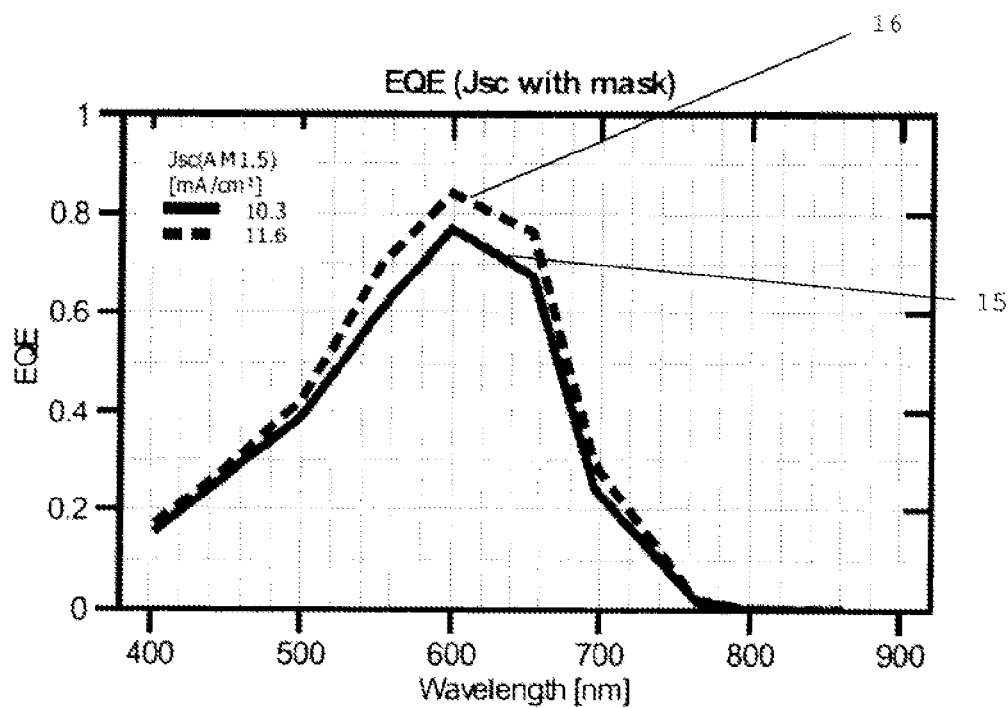
Figure 28:
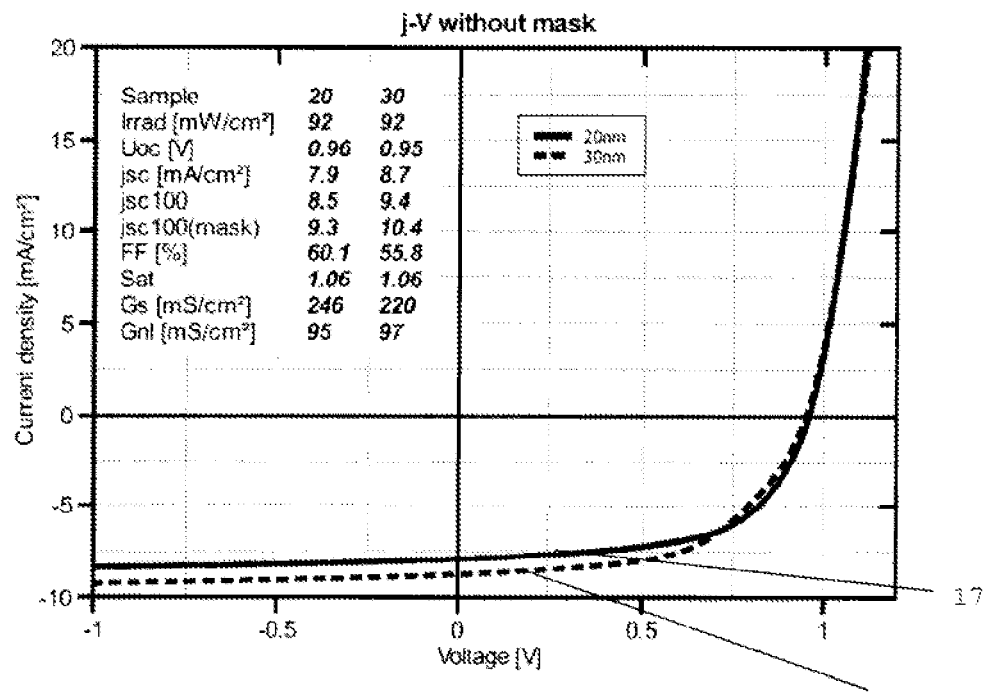
Figure 29:
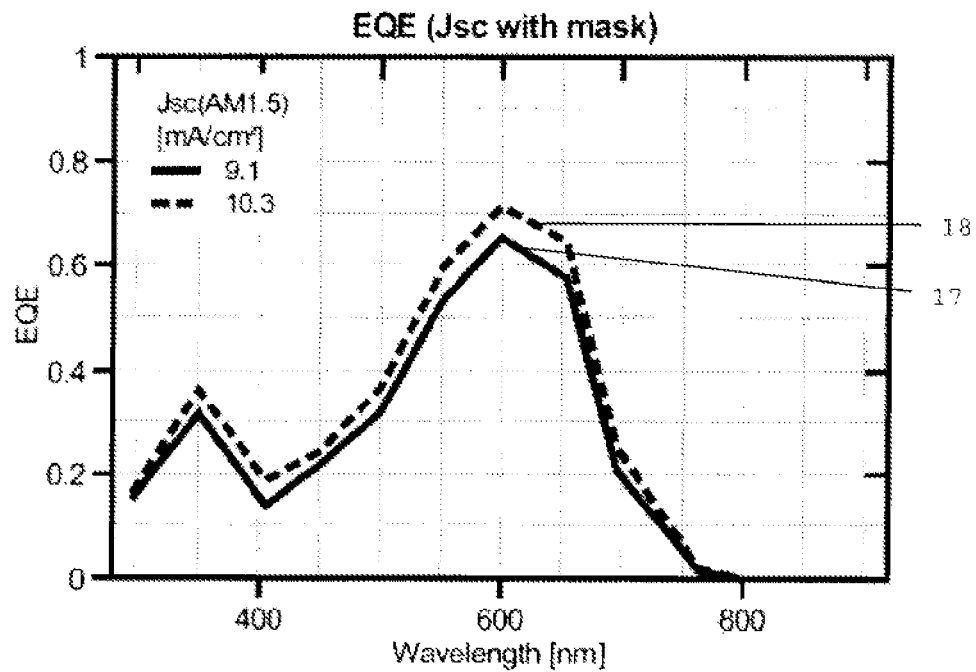
Figure 30:
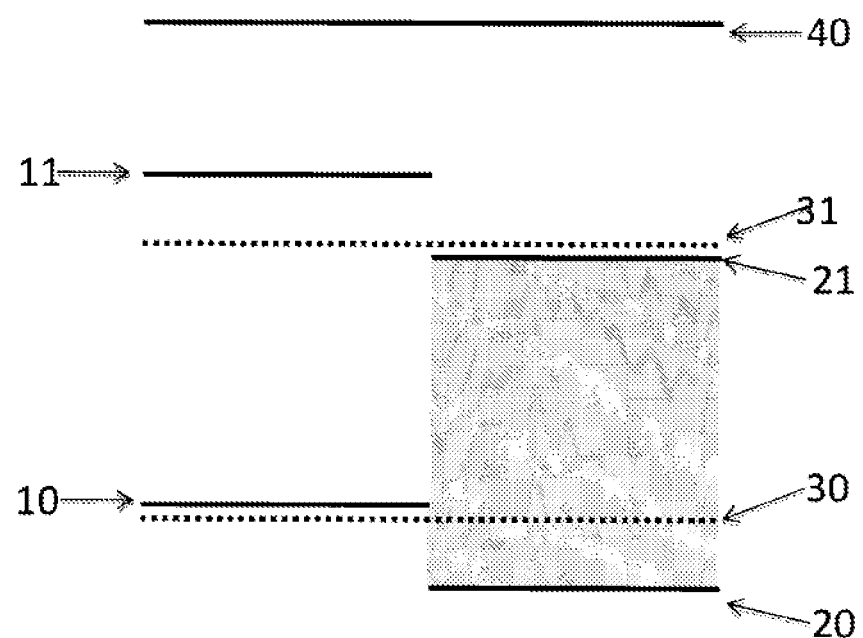

FIG. 18 a current-voltage characteristic of a comparative component having two materials in the photoactive layer, deposited at substrate temperature 70° C., FIG. 19 a current-voltage characteristic of a component having the same layer structure as shown in FIG. 18, but with three materials in the photoactive layer, using compound (VI) as the third material and with deposition at room temperature, FIG. 20 a current-voltage characteristic of a comparative component having two materials in the photoactive layer, FIG. 21 a representation of the external quantum efficiency of a comparative component having two materials in the photoactive layer, FIG. 22 a representation of the fill factor characteristics and the open-circuit voltage of a comparative component having two materials in the photoactive layer as a function of insolation, FIG. 23 a current-voltage characteristic of a component of the invention having three materials in the photoactive layer, FIG. 24 a representation of the external quantum efficiency of a component having three materials in the photoactive layer, FIG. 25 a representation of the fill factor characteristics and the open-circuit voltage of a component of the invention having three materials in the photoactive layer as a function of insolation, FIG. 26 a current-voltage characteristic of a comparative component having two materials in the photoactive layer, FIG. 27 a representation of the external quantum efficiency of a comparative component having two materials in the photoactive layer, FIG. 28 a current-voltage characteristic of a component of the invention having three materials in the photoactive layer, FIG. 29 a representation of the external quantum efficiency of a component having three materials in the photoactive layer and FIG. 30 a schematic diagram of an energy scheme with three materials.

DETAILED DESCRIPTION

In a working example of the invention, FIG. 1 shows a schematic of a component 1 executed, by way of example, as inorganic solar cell. Component 1 is disposed on a transparent substrate 2 which is preferably executed in a flexible manner, for instance as a film. Disposed atop the substrate 2 is an electrode 3 which is executed from metal, a conductive oxide, especially ITO, ZnO:Al or other TCOs or a conductive polymer, for instance PEDOT:PSS or PANI. Disposed atop the electrode 3 is a charge carrier transport layer 4 executed, for example, as an electron or hole transport layer. Disposed atop this charge carrier transport layer 4 is a photoactive layer 5 comprising at least one donor material and one acceptor material which together form a donor-acceptor system. In addition, the photoactive layer comprises a third material having a proportion of 0.1% by weight <x<10% by weight. This third material is selected from a group consisting of crown ethers, triphenyls, sorbitols, quinacridones, bis(4-(tert-butyl) benzoato-O)hydroxy-aluminum. Disposed atop the photoactive layer 5 is a further charge carrier transport layer 6. This charge carrier transport layer 6 likewise takes the form of an electron or hole transport layer, the charge carrier transport layer 6 being set up to be complementary to the charge carrier transport layer 4. Disposed atop this charge carrier transport layer 6 is a counterelectrode 7 formed, for example, from a metal, for instance A1.

In a second working example, the component 1 of the invention has a photoactive layer 5 comprising three materials, wherein a donor material D1 and an acceptor material A1 form a donor-acceptor system. The donor material D1 is, for example, a material from the class of the phthalocyanines, perylene derivatives, TPD derivatives, oligothiophenes or a material, as disclosed in WO2006092134 A1, WO2011161262 or WO2011161170A1. The acceptor material A1 is, for example, a fullerene or fullerene derivative (C60, C70, etc.). The photoactive layer 5 further comprises a third material which takes the form of a further donor material D2. The third material D2 affects the propensity of the donor material D1 to crystallize. In an alternative configuration, the third material is an acceptor material A2 which affects the propensity of the acceptor material A1 to crystallize.

In a further working example, the photoactive component 1 has, for example, the following structure: ITO/C60/photoactive mixed layer/BPAPF (9,9-bis[4-[N,N-bis(biphenyl-4-yl)amino]phenyl]-9H-fluorene)/BPAPF:NDP9/NDP9/Au wherein the photoactive mixed layer comprises, as third material, one of the following compounds in an addition of <7%:

Compound (I)

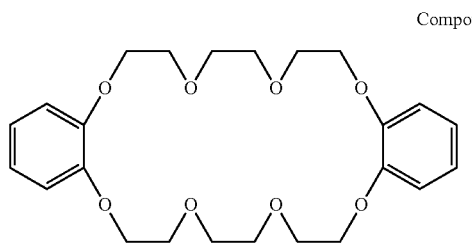

Compound (II)

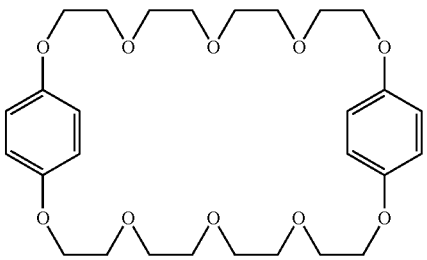

Compound (III)

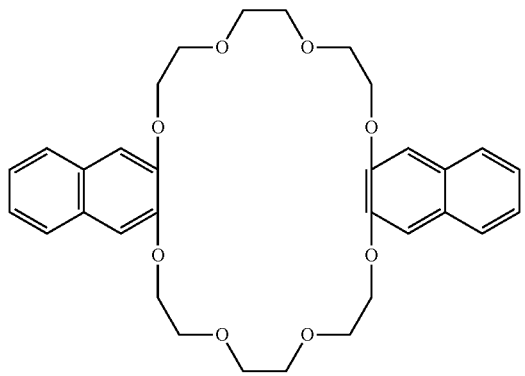

Compound (IV)

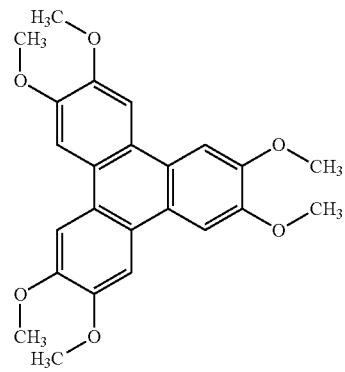

Compound (V)

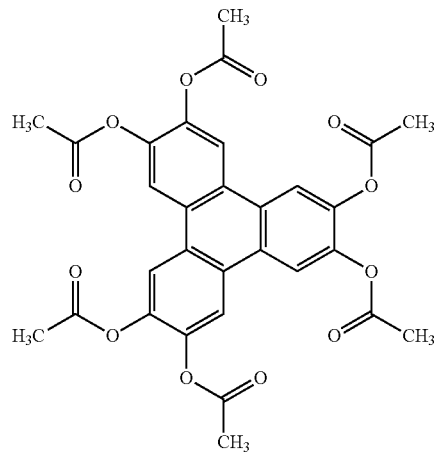

-continued

Compound (VI)

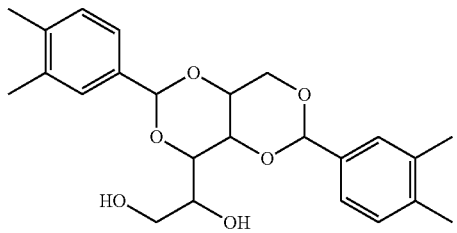

In a further working example, FIGS. 2 and 3 show the test results for a component 1 having a photoactive layer 5 with a donor-acceptor system in the form of a graph, where the photoactive layer 5 has a layer thickness of 30 nm. The photoactive layer 5 was deposited at a substrate temperature of 70° C. FIG. 2 shows the current-voltage characteristic of a component 1 with a donor-acceptor system, and FIG. 3 a current-voltage characteristic for a component with a photoactive layer comprising the donor-acceptor system and compound (I). The photoactive layer 5 in the components differs here only in terms of the addition of the compound (I). In this case, a rise in the fill factor (FF) from 46% to 58.6% caused by the addition of compound (I) is found.

It can be inferred from the comparison of the fill factors (FF) that the addition of the third material has a significant influence on the current generated.

In a further working example, FIGS. 4 and 5 show the test results for a component 1 having a photoactive layer 5 with a different donor-acceptor system in the form of a graph, where the photoactive layer 5 has a layer thickness of 30 nm. The photoactive layer 5 was deposited at a substrate temperature of 70° C. FIG. 4 shows the current-voltage characteristic of a component I with a donor-acceptor system, and FIG. 5 a current-voltage characteristic for a component with a photoactive layer comprising the donor-acceptor system and compound (I). The photoactive layer 5 in the components differs here only in terms of the addition of the compound (I). In this case, a rise in the fill factor (FF) from 48.8% to 65.7% caused by the addition of compound (I) is found.

In a further working example, FIGS. 6 and 7 show the test results for a component 1 having a photoactive layer 5 with a third donor-acceptor system in the form of a graph, where the photoactive layer 5 has a layer thickness of 30 nm. The photoactive layer 5 was deposited at a substrate temperature of 70° C. FIG. 6 shows the current-voltage characteristic of a component 1 with a donor-acceptor system, and FIG. 7 a current-voltage characteristic for a component with a photoactive layer comprising the donor-acceptor system and compound (I). The photoactive layer 5 in the components differs here only in terms of the addition of the compound (I). In this case, a rise in the fill factor (FF) from 50.7% to 62.7% caused by the addition of compound (I) is found.

In a further working example, FIGS. 8 and 9 show the test results for a component 1 having a photoactive layer 5 with a donor-acceptor system in the form of a graph, where the photoactive layer 5 has a layer thickness of 30 nm. The photoactive layer 5 was deposited at a substrate temperature of 70° C. FIG. 8 shows the current-voltage characteristic of a component 1 with a donor-acceptor system, and FIG. 9 a current-voltage characteristic for a component with a photoactive layer comprising the donor-acceptor system and compound (II). The photoactive layer 5 in the components differs here only in terms of the addition of the compound (II). In this case, a rise in the fill factor (FF) from 461 to 50.6% caused by the addition of compound (II) is found.

In a further working example, FIGS. 10 and 11 show the test results for a component 1 having a photoactive layer 5 with a further donor-acceptor system in the form of a graph, where the photoactive layer 5 has a layer thickness of 30 nm. The photoactive layer 5 was deposited at a substrate temperature of 70° C. FIG. 10 shows the current-voltage characteristic of a component 1 with a donor-acceptor system, and FIG. 11 a current-voltage characteristic for a component with a photoactive layer comprising the donor-acceptor system and compound (V). The photoactive layer 5 in the components differs here only in terms of the addition of the compound (V). In this case, a rise in the fill factor (FF) from 48.8% to 60.2% caused by the addition of compound (V) is found.

In a further working example, FIGS. 12 and 13 show the test results for a further component 1 having a photoactive layer 5 with a donor-acceptor system in the form of a graph, where the photoactive layer 5 has a layer thickness of 30 nm. The photoactive layer 5 was deposited at a substrate temperature of 70° C. FIG. 12 shows the current-voltage characteristic of a component 1 with a donor-acceptor system, and FIG. 13 a current-voltage characteristic for a component with a photoactive layer comprising the donor-acceptor system and compound (VI). The photoactive layer 5 in the components differs here only in terms of the addition of the compound (VI). In this case, a rise in the fill factor (FF) from 48.8% to 60.3% caused by the addition of compound (VI) is found.

In a further working example, FIGS. 14 and 15 show the test results for a further component 1 having a photoactive layer 5 with a donor-acceptor system in the form of a graph, where the photoactive layer 5 has a layer thickness of 30 nm. The photoactive layer 5 was deposited at a substrate temperature of 70° C. FIG. 14 shows the current-voltage characteristic of a component 1 with a donor-acceptor system, and FIG. 15 a current-voltage characteristic for a component with a photoactive layer comprising the donor-acceptor system and compound (III). The photoactive layer 5 in the components differs here only in terms of the addition of the compound (III). In this case, a rise in the fill factor (FF) from 60.0% to 65.2% caused by the addition of compound (III) is found.

In a further working example, FIGS. 16 and 17 show the test results for a component 1 having a photoactive layer 5 with a donor-acceptor system in the form of a graph, where the photoactive layer 5 has a layer thickness of 30 nm. The photoactive layer 5 was deposited at a substrate temperature of 70° C. in the case of FIG. 16 and at room temperature in the case of FIG. 17. FIG. 16 shows the current-voltage characteristic of a component 1 with a donor-acceptor system, and FIG. 17 a current-voltage characteristic for a component with a photoactive layer comprising the donor-acceptor system and compound (I). The photoactive layer 5 in the components differs here in terms of the addition of the compound (I) and the substrate temperature in the deposition of the photoactive layer 5. In this case, it is found that the fill factors are virtually the same at 64% (FIG. 16) and 63.6% (FIG. 17). Through the addition of compound (I), it is thus possible to achieve the same fill factor at lower substrate temperatures as in the case of heated substrates without addition. Through the addition, it is thus possible to achieve more simplified conditions in the deposition.

In a further working example, FIGS. 18 and 19 show the test results for a component 1 having a photoactive layer 5 with a donor-acceptor system in the form of a graph, where the photoactive layer 5 has a layer thickness of 30 nm. The photoactive layer 5 was deposited at room temperature in the case of FIG. 18 and in the case of FIG. 19. FIG. 18 shows the current-voltage characteristic of a component 1 with a donor-acceptor system, and FIG. 19 a current-voltage characteristic for a component with a photoactive layer comprising the donor-acceptor system and compound (VI). The photoactive layer 5 in the components differs here in terms of the addition of the compound (VI) and the substrate temperature in the deposition of the photoactive layer 5. In this case, it is found that the fill factors, at 55.1% (FIG. 18) and 60.9% (FIG. 19) are increased by addition of the compound (VI).

In a further working example, the component 1 of the invention has a photoactive layer 5 comprising three materials, wherein a donor material D1 and an acceptor material A1 form a donor-acceptor system. The donor material D1 is, for example, a material from the class of the phthalocyanines, perylene derivatives, TPD derivatives, oligothiophenes or a material as disclosed in WO2006092134 A1, WO2011161262 or WO2011161170A1. The acceptor material A1 is, for example, a fullerene or fullerene derivative (C60, C70, etc.). The photoactive layer 5 further comprises a third material which takes the form of a further donor material D2. The third material D2 affects the propensity of the donor material D1 to crystallize. In an alternative configuration, the third material is an acceptor material A2 which affects the propensity of the acceptor material A1 to crystallize.

In a further working example, FIGS. 20 to 22 show the test results for a component 1 having a photoactive layer 5 with a donor-acceptor system in the form of a graph, where the photoactive layer 5 has a layer thickness of 20 nm (11) or of 30 nm (12). FIG. 20 shows the current-voltage characteristics of component 1, FIG. 21 the representation of the external quantum efficiency and FIG. 22 a plot of the fill factor (FF) and the open-circuit voltage ($U_{oc}$) against irradiance.

In a further working example, FIGS. 23 to 25 show the test results for a component 1 having a photoactive layer 5 with a donor-acceptor system having further donor D2 as third material in the form of a graph, where the photoactive layer 5 has a layer thickness of 20 nm (13) or of 30 nm (14) and has been added in each case in a ratio of 1:1:1. FIG. 23 shows the current-voltage characteristics of inventive component 1, FIG. 24 the representation of the external quantum efficiency and FIG. 25 a plot of the fill factor (FF) and the open-circuit voltage ($U_{oc}$) against irradiance.

It can be inferred from the comparison of the characteristic values of fill factor (FF) and current generated that the addition of the third material has a significant influence on the current generated. Particularly the comparison of FIG. 21 and FIG. 24 shows the influence of the third material on the external quantum efficiency, which is much more marked in FIG. 24 compared to FIG. 21.

In a further working example, FIGS. 26 and 27 show the test results for a component 1 having a photoactive layer 5 with a donor-acceptor system in the form of a graph, where the photoactive layer 5 has a layer thickness of 20 nm (15) or of 30 nm (16). FIG. 26 shows the current-voltage characteristics of component 1 and FIG. 27 the representation of the external quantum efficiency.

In a further working example, FIGS. 28 and 29 show the test results for a component 1 having a photoactive layer 5 with a donor-acceptor system having further donor D2 as third material in the form of a graph, where the photoactive layer 5 has a layer thickness of 20 nm (17) or 30 nm (18). The layer 5 has a ratio of acceptor:donorD1:donorD2=1:1:0.1. FIG. 28 shows the current-voltage characteristics of inventive component 1 and FIG. 29 the representation of the external quantum efficiency.

It can be inferred from the comparison of the characteristic value of fill factor (FF) that the addition of the third material donor D2 has a significant influence on the fill factor. Particularly the comparison of FIG. 26 and FIG. 28 shows the influence of the third material on the fill factor, which is higher in FIG. 28 compared to FIG. 26.

In a further working example, FIG. 30 shows an energy scheme of a component having a photoactive layer with a donor material, an acceptor material and a third material. The HOMO position of the donor material 10 and the LUMO position of the donor material 11 can be inferred from FIG. 30. In addition, FIG. 30 shows the HOMO position of the acceptor 20 and the LUMO position of the acceptor 21. In addition, FIG. 30 shows the HOMO position of the third material 30 and the LUMO position of the third material 31. As can be inferred from FIG. 30, this has a HOMO position 30 of an order of magnitude equal to or greater than the HOMO position of the donor material, and a LUMO position 31 of an order of magnitude equal to or less than the LUMO position of the acceptor, i.e. between the LUMO position of the acceptor and the vacuum level. The vacuum level of the energy is represented by reference numeral 40.

The invention claimed is:

1. An optoelectronic component comprising at least one transport layer and at least one photoactive layer disposed between an electrode and a counterelectrode, wherein the at least one photoactive layer is a mixed layer consisting of at least one donor material, at least one acceptor material, and at least one crown ether, wherein:
   i) a donor of the at least one donor material comprises an oligomer;
   ii) an acceptor of the at least one acceptor material comprises a fullerene and/or fullerene derivative;
   iii) the at least one crown ether is selected from formulas Ia and Ib:

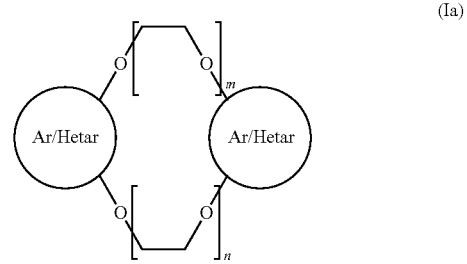

(Ia)

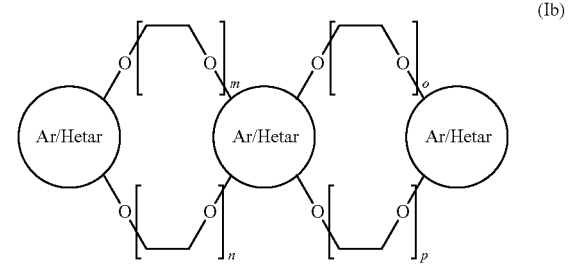

(Ib)

wherein:
   a) m and n are each independently 3, 4, 5, or 6 for the at least one crown ether of formula Ia;

b) m and n are each independently 1, 2, 3, 4, 5, or 6 for the at least one crown ether of formula Ib;
c) Ar is phenyl, biphenyl, triphenyl, naphthyl, binaphthyl, 3-6 fused phenyl rings, anthracenyl, phenanthrenyl, or pyrenyl;
d) Hetar is thiophene, pyrrole, furan, oxazole, thiazole, oxadiazole, thiadiazole, triazole, pyridine, pyrimidine, pyrazine, benzothiophenes, benzopyrrole, benzofuran, benzothiophene, benzo-pyrrole, benzofuran, benzoxazole, benzothiazole, thienothiophenes, thienopyrrole, thienofuran, 3-6 fused heterocycles, dithienothiophene, dithienopyrrole, dithienobenzene, dithienocyclopentadienes, or dipyrrolobenzene;
e) ether bridges joined in any position selected from a group consisting of 1,2, 1,3 and 1,4 positions on any ring selected from a group consisting of phenyl ring, naphthyl ring, fused phenyl ring, heteroaryl ring, and fused heteroaryl ring; and
f) o and p are each independently 0, 1, 2, 3, 4, 5, 6; wherein the photoactive layer optionally comprises at least one triphenyl, sorbitol, quinacridone, and/or bis(4-(tert-butyl)benzoato-O)hydroxyaluminum; and the at least one donor material and the at least one acceptor material form a donor-acceptor system.

2. The optoelectronic component as claimed in claim 1, wherein the at least one crown ether has an energy level at which magnitude of LUMO ≤ magnitude of LUMO of the at least one acceptor material, and magnitude of HOMO ≥ magnitude of energy level of HOMO of the at least one donor material.

3. The optoelectronic component as claimed in claim 2, wherein the at least one crown ether has a LUMO energy level that is 0.3 eV lower than the magnitude of the LUMO of the at least one acceptor material and/or a HOMO energy level that is 0.3 eV greater than the magnitude of the energy level of the HOMO of the at least one donor material.

4. The optoelectronic component as claimed in claim 1, wherein a proportion of the at least one crown ether in the photoactive layer is 0.1% by weight <x<30% by weight.

5. The optoelectronic component as claimed in claim 1, wherein the at least one donor material is selected from: phthalocyanines, perylene derivatives, TPD derivatives, and oligothiophenes.

6. The optoelectronic component as claimed in claim 1, wherein a molecular structure of the at least one crown ether causes a lattice defect in the at least one donor material and/or the at least one acceptor material.

7. The optoelectronic component as claimed in claim 1, wherein the at least one crown ether is selected such that the at least one crown ether establishes a minimum separation between the at least one donor material and the at least one acceptor material, and wherein the at least one crown ether simultaneously contributes to phase separation of the at least one donor material and the at least one acceptor material.

8. The optoelectronic component as claimed in claim 1, wherein the at least one crown ether promotes crystallization of the at least one donor material and the at least one acceptor material.

9. An optoelectronic component comprising at least one transport layer and at least one photoactive layer disposed between an electrode and a counterelectrode, wherein the photoactive layer is a mixed layer comprising at least one donor material, at least one acceptor material, and at least one crown ether, wherein:

i) the at least one donor material is a donor comprising an oligomer;
ii) the at least one acceptor material is an acceptor comprising a fullerene and/or fullerene derivative; and
iii) the at least one crown ether is selected from:

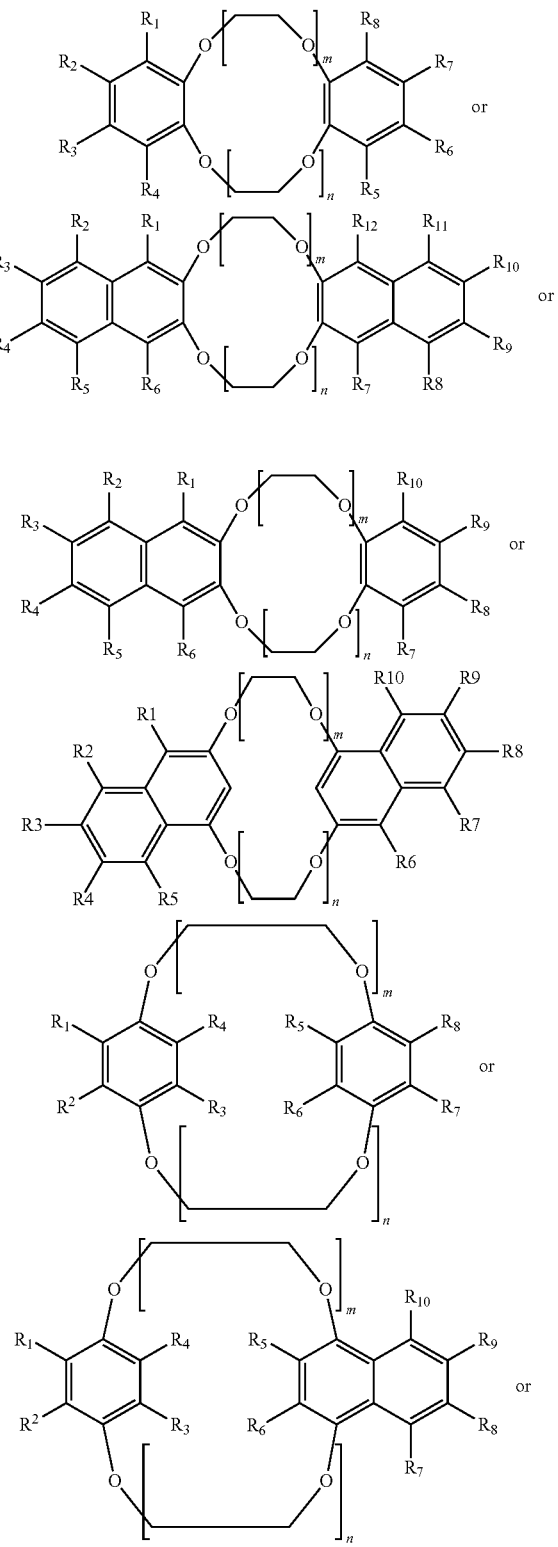

-continued

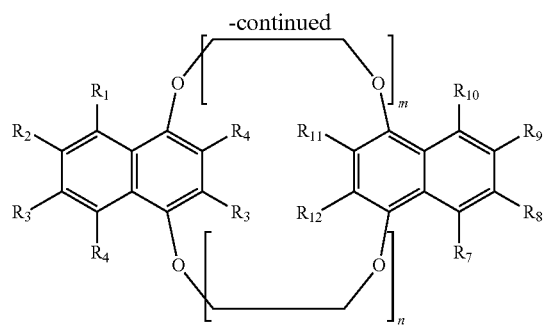

wherein:
n and m are each independently selected from 4 and 5, and
$R_1$, $R_2$, $R_3$, $R_4$, $R_5$, $R_6$, $R_7$, $R_8$, $R_9$, $R_{10}$, $R_{11}$ and $R_{12}$ are each independently selected from H, $CH_3$, $C_2H_5$, $C_3H_7$, $C_4H_9$, $C_5H_{11}$, $C_6H_{13}$, isobutyl, $CF_3$, $C_2F_5$, $C_3F_7$, $C_4F_9$, $C_5F_{11}$, $C_6F_{13}$, OH, O—$CH_3$, $CH_2$—O—$CH_3$, $CH_2$—O—$CH_2$—$CH_3$, CN, phenyl, thiophene.

10. The optoelectronic component as claimed in claim 1, wherein the optoelectronic component comprises an organic solar cell.

11. The optoelectronic component as claimed in claim 4, wherein the proportion of the at least one crown ether in the photoactive layer is 0.1% by weight <x<20% by weight.

12. The optoelectronic component as claimed in claim 4, wherein the proportion of the at least one crown ether in the photoactive layer is 0.1% by weight <x<10% by weight.

13. The optoelectronic component as claimed in claim 1, wherein the at least one donor material, the at least one acceptor material and the at least one crown ether are evaporated under vacuum.

14. The optoelectronic component as claimed in claim 1, wherein m and n are each independently 4, 5, or 6 for the at least one crown ether of formula Ia.

15. The optoelectronic component as claimed in claim 14, wherein m and n are each independently 3, 4, 5, or 6 for the at least one crown ether of formula Ib.

16. The optoelectronic component as claimed in claim 1, wherein the at least one crown ether is selected from:

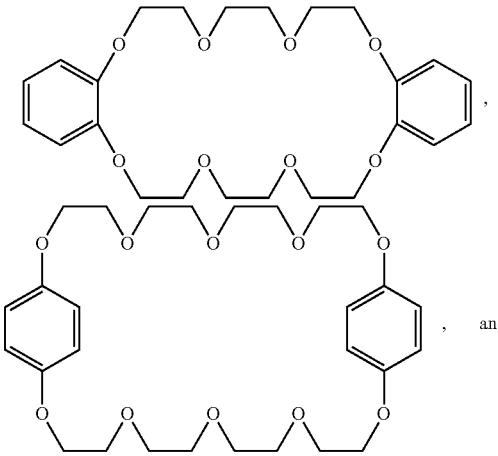

, and

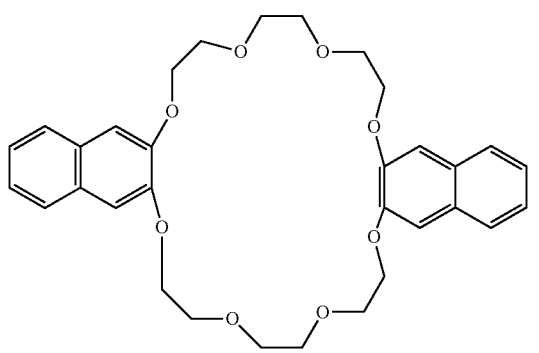

.

17. The optoelectronic component as claimed in claim 9, wherein the optoelectronic component comprises an organic solar cell.

18. The optoelectronic component as claimed in claim 9, wherein a proportion of the at least one crown ether in the photoactive layer is 0.1% by weight <x<30% by weight.

* * * * *